US010109703B2

(12) United States Patent  
Miyanaga

(10) Patent No.: US 10,109,703 B2  
(45) Date of Patent: Oct. 23, 2018

(54) DISPLAY DEVICE

(71) Applicant: Japan Display Inc., Tokyo (JP)

(72) Inventor: Naoki Miyanaga, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/673,481

(22) Filed: Aug. 10, 2017

(65) Prior Publication Data

US 2018/0061925 A1 Mar. 1, 2018

(30) Foreign Application Priority Data

Aug. 31, 2016 (JP) ................. 2016-169022

(51) Int. Cl.
*H01L 27/32* (2006.01)
*G02F 1/1333* (2006.01)
*G02F 1/1343* (2006.01)

(52) U.S. Cl.
CPC ........ *H01L 27/3276* (2013.01); *G02F 1/1343* (2013.01); *G02F 1/133345* (2013.01)

(58) Field of Classification Search
CPC ............ G02F 1/133345; G02F 1/1343; H01L 27/3276
See application file for complete search history.

(56) References Cited

U.S. PATENT DOCUMENTS

| | | | |
|---|---|---|---|
| 8,248,568 B2 | 8/2012 | Anjo et al. | |
| 8,634,049 B2 | 10/2014 | Anjo et al. | |
| 8,867,011 B2 | 10/2014 | Anjo et al. | |
| 9,041,893 B2 | 5/2015 | Anjo et al. | |
| 9,389,471 B2 | 7/2016 | Anjo et al. | |
| 9,576,985 B2 | 2/2017 | Anjo et al. | |
| 2016/0091764 A1 | 3/2016 | Asozu et al. | |
| 2017/0123283 A1 | 5/2017 | Anjo et al. | |

FOREIGN PATENT DOCUMENTS

JP 2009-265484 A 11/2009
JP 2016-071228 A 5/2016

*Primary Examiner* — Kevin Quarterman
(74) *Attorney, Agent, or Firm* — Typha IP LLC

(57) ABSTRACT

A display device having a display region and a peripheral region in contact with the display region above a substrate is provided. The display region has a plurality of pixels each including a transistor, an insulating film above the transistor, a pixel electrode arranged above the insulating film and electrically connected to the transistor, and a common electrode above the insulating film, a video signal line and a gate signal line electrically connected to the transistor, and liquid crystal layer above the plurality of pixels. The peripheral region has a terminal electrically connected to the video signal line, a wiring arranged parallel to the gate wiring between the display region and the terminal, and a plurality of first electrodes above the wiring. The insulating film covers the wiring, and the wiring is electrically connected to the plurality of first electrodes via an opening in the insulating film.

20 Claims, 18 Drawing Sheets

DISPLAY DEVICE

CROSS REFERENCE TO RELATED APPLICATIONS

This application is based on and claims the benefit of priority from the prior Japanese Patent Application No. 2016-169022, filed on Aug. 31, 2016, the entire contents of which are incorporated herein by reference.

FIELD

One of the embodiments of the present invention relates to a liquid crystal display device.

BACKGROUND

A liquid crystal display device is known as a typical example of a display device. A liquid crystal display device has a plurality of liquid crystal elements, and the liquid crystal elements have a pair of electrodes (pixel electrode, counter electrode) and a layer (liquid crystal layer) of compounds (liquid crystal molecules) having liquid crystallinity interposed therebetween as a basic structure. Polarized light incident to the liquid crystal layer through one of a pair of polarization plates arranged so as to sandwich the liquid crystal elements is output through the other polarization plate after the polarization plane thereof is rotated by the liquid crystal layer. The rotation of the polarization plane is determined by the orientation of the liquid crystal molecules in the liquid crystal layer. By forming an electric field in the liquid crystal layer using a pair of electrodes, the liquid crystal molecules change from an initial orientation state to an orientation state determined by the electric field. As this orientation state changes, transmissivity of the liquid crystal elements changes, and a gradation display is realized.

In the region in which display is performed (display region), by applying an appropriate electric field to the liquid crystal layer according to the gradation displayed, a high-quality display can be performed. The liquid crystal layer is usually sealed between a pair of electrodes by a seal. However, when impurities such as metal ions and inorganic anions, or organic acids penetrate into the liquid crystal layer from the outside, an appropriate electric field cannot be maintained due to these impurities, causing display defects such as display speckles and burn-in. A trap electrode arranged to prevent ionic impurities from entering the liquid crystal layer outside the display area has been disclosed as a countermeasure against these display defects in Japanese Laid-Open Patent Publication 2009-265484 and Japanese Laid-Open Patent Publication 2016-71228.

SUMMARY

One of the embodiments of the present invention is a display device having a display region and a peripheral region in contact with the display region above a substrate. The display region has a plurality of pixels each including a transistor, an insulating film above the transistor, a pixel electrode above the insulating film and electrically connected to the transistor, and a common electrode above the insulating film, a video signal line and a gate signal line electrically connected to the transistor, and a liquid crystal layer above the plurality of pixels. The peripheral region has a terminal electrically connected to the video signal line, a wiring arranged parallel to the gate signal line between the display region and the terminal, and a plurality of first electrodes above the wiring. The insulating film covers the wiring, and the wiring is electrically connected to the plurality of first electrodes via an opening formed in the insulating film.

One of the embodiments of the present invention is a display device having a substrate, a display region above the substrate, a wiring arranged above the substrate and surrounding the display region, and a plurality of first electrodes and a plurality of second electrodes overlapping the wiring. The display region has a rectangle shape having a first side, a second side, a third side, and a fourth side, the plurality of first electrodes is closest to the first side, the third side faces the first side, and the second side faces the fourth side. The display region has a plurality of pixels each including a transistor, an insulating film above the transistor, a pixel electrode arranged above the insulating film and electrically connected to the transistor, and a common electrode above the insulating film, a video signal line and a gate signal line electrically connected to the transistor, and a liquid crystal layer above the plurality of pixels. The plurality of first electrodes are arranged along the first side. The plurality of second electrodes are arranged along the second side, the third side, and the fourth side, and are in the same layer as the pixel electrode. The plurality of first electrodes and second electrodes are electrically connected to the wiring via an opening in the insulating film.

One of the embodiments of the present invention is a display device having a substrate, a display region above the substrate, a wiring arranged above the substrate and surrounding the display region, and a plurality of first electrodes and second electrodes arranged above the wiring and overlapping the wiring. The display region is a rectangle having a first side, a second side, a third side, and a fourth side, the plurality of first electrodes is closest to the first side, the third side faces the first side, and the second side faces the fourth side. The display region has a plurality of pixels each including a transistor, an insulating film above the transistor, a pixel electrode arranged above the insulating film and electrically connected to the transistor, and a common electrode above the insulating film, a video signal line and a gate signal line electrically connected to the transistor, and a liquid crystal layer above the plurality of pixels. The plurality of first electrodes are arranged along the first side. The second electrodes are arranged continuously along the second side, the third side, and the fourth side, and are in the same layer as the pixel electrode. The plurality of first electrodes and second electrodes are electrically connected to the wiring via an opening in the insulting film.

One of the embodiments of the present invention is a driving method of a display device. This driving method includes performing writing at a frequency lower than 60 Hz. The display device has a display region and a peripheral region in contact with the display region above a substrate. The display region has a plurality of pixels each including a transistor having a gate electrode, a source electrode, and a drain electrode, an insulating film above the transistor, a pixel electrode electrically connected to the transistor, and a common electrode above the insulating film, a video signal line electrically connected to the drain electrode, a gate signal line electrically connected to the gate electrode, and a liquid crystal layer above the plurality of pixels. The peripheral region has a terminal electrically connected to the video signal line, a wiring arranged between the display region and the terminal, and a plurality of first electrodes above the wiring. The insulating film is arranged above the wiring, and the wiring is electrically connected to the plurality of first electrodes via an opening in the insulating film.

DESCRIPTION OF EMBODIMENTS

Hereinafter, each embodiment of the present invention will be described while referencing the drawings. However, the present invention may be implemented in various ways without deviating from the gist, thus interpretation thereof should not be limited to the content exemplified in the embodiments below.

In order to provide a clearer description, a width, thickness, shape, etc. of each component are represented schematically compared with those of the actual modes. These drawings are merely examples and do not limit the interpretation of the present invention. In this specification and each of the drawings, elements similar to previously described elements are marked with the same symbols and detailed descriptions are omitted accordingly.

In the present invention, when one film is processed and a plurality of films are formed, these films have different functions and roles. However, these films are derived from the same film formed in the same layer in the same process, and have the same layer structure and the same materials. Accordingly, these films are defined as being in the same layer.

In the scope of the present specification and the claims, expressing a state in which a structure is arranged above another structure is simply described as "above," and unless otherwise noted, includes both cases in which a structure is arranged directly above another structure so as to be touching, and in which a structure is arranged above another structure via further another structure.

Embodiment 1

In the present embodiment, the structure of a display device 100 which is one embodiment of the present invention will be described using FIG. 1A through FIG. 11.

[1. Outline Structure]

Figure 1A:
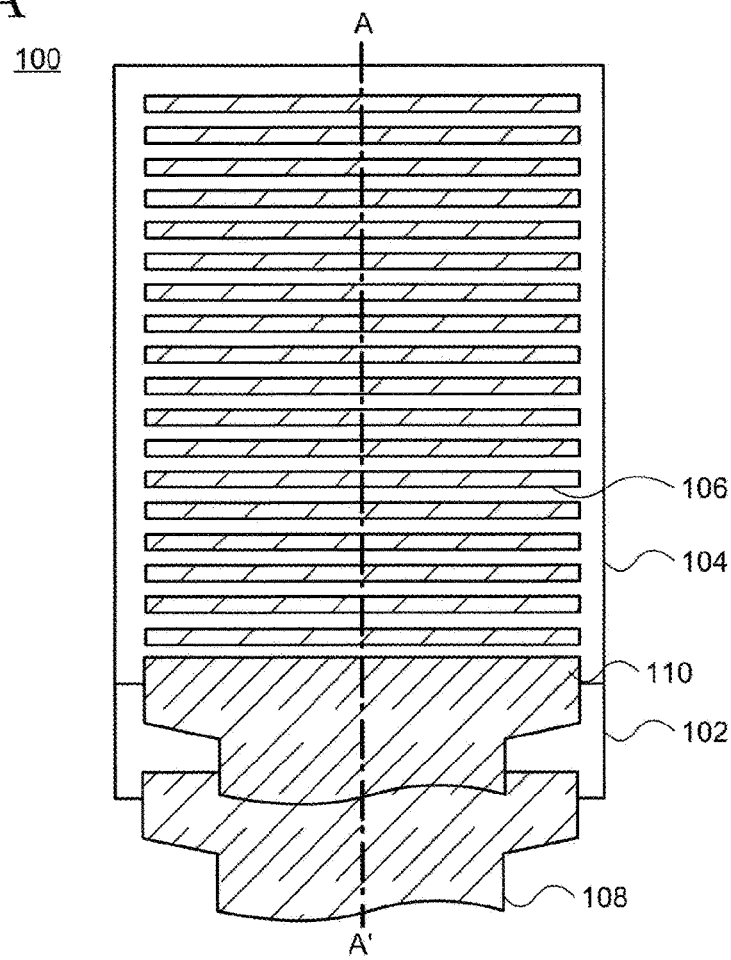
FIG. 1A and FIG. 1B: Schematic top view and cross-sectional view of a display device of one embodiment of the present invention.

FIG. 1A is a schematic top view of the display device 100. As is shown in FIG. 1A, the display device 100 has a substrate 102 and a counter substrate 104 arranged above the substrate 102. The counter substrate 104 has a smaller area compared to the substrate 102, thus, a portion of the substrate 102 is exposed from the counter substrate 104. The shapes of the substrate 102 and the counter substrate 104 are not limited, and may be a rectangle shape as shown in FIG. 1A. One of the substrate 102 and the counter substrate 104 may have a square shape.

A plurality of wirings (Rx wiring or Rx electrode 106) extending perpendicular to the longitudinal direction of the counter substrate 104 is formed in a striped pattern and provided above the counter substrate 104. The Rx wiring 106 is paired with a common electrode 154 to be described later, and gives a touch panel function to the display device 100. Connectors 108, 110 such as flexible printed circuit (FPC) boards are connected to one side of the substrate 102 and one side of the counter substrate 104, respectively. Various signals are supplied from the external circuit (not illustrated) via the connector 108 to the pixels 120 to be described later, by which images are reproduced by the pixels 120. On the other hand, signals are supplied from the external circuit to the Rx wiring 106 via the connector 110, and a function as a touch panel is expressed.

Figure 1B:
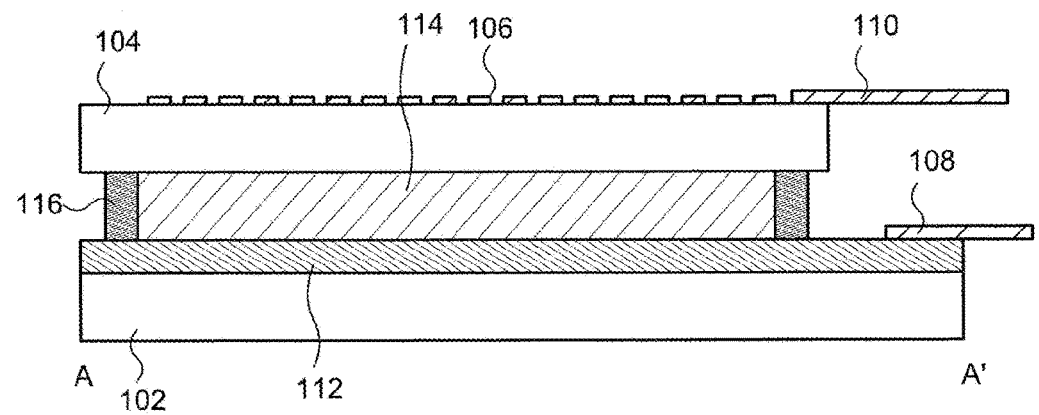

A schematic view of the cross section taken along the dotted line A-A' in FIG. 1A is shown in FIG. 1B. As is shown in FIG. 1B, the Rx wiring 106 is provided above the counter substrate 104, and the Rx wiring 106 is connected to the connector 110 by a wiring not illustrated. A pixel layer 112 including semiconductor elements such as a transistor is provided above the substrate 102. A plurality of pixels 120 is formed in the pixel layer 112, and the pixels 120 are controlled by signals supplied from the external circuit via the connector 108. A liquid crystal layer 114 is sandwiched between the substrate 102 and the counter substrate 104, and the liquid crystal layer 114 is sealed by a seal 116 (sealant).

[2. Substrate]

Figure 2:
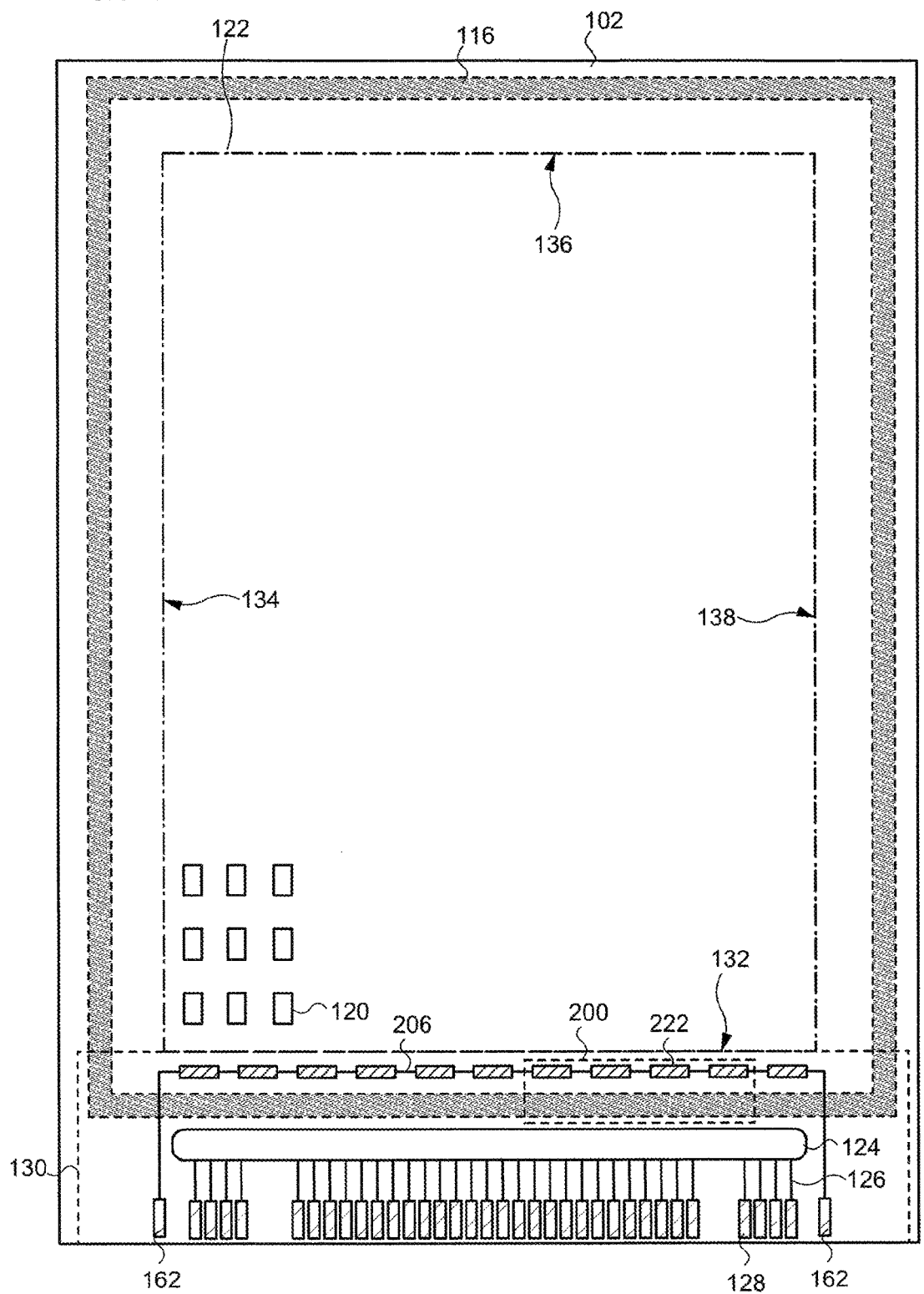
FIG. 2: Schematic top view of a display device of one embodiment of the present invention.

A schematic top view of the substrate 102 is shown in FIG. 2. The plurality of pixels 120 are arranged in the pixel layer 112 above the substrate 102. The pixels 120 may be arranged in a matrix, and their array pattern may be arbitrarily selected. For example, the pixels 120 may be arranged in a stripe array or a delta array. Two adjacent pixels 120 may be configured so as to provide different colors from one another. For example, by adjacently arranging three pixels 120 providing the primary colors red, blue, and green, respectively, a full color display is possible. The colors provided by the pixels 120 are not limited to primary colors, and four colors red, blue, green, and white may be combined using a fourth pixel 120, for example. The region in which the plurality of pixels 120 are provided is the display region 122, and images are displayed in the display region 122. The shape of the display region 122 is arbitrary, and may be a polygonal shape including a rectangle, square shape, and a round shape. The display region 122 shown in FIG. 2 has a rectangle shape, in which among the four sides of the rectangle, a first side 132 is closest to terminals 128, a side facing the first side 132 is a third side 136, and sides perpendicularly intersecting the first side 132 and facing each other are a second side 134 and a fourth side 138. In addition, the outer side of the display region 122 is defined as a peripheral region. The peripheral region includes the region in which the substrate 102 is exposed from the counter substrate 104.

The drive of the pixels 120 is controlled by a drive circuit 124 during a period in which images are displayed using the pixels 120 (hereinafter written as display period). The drive circuit 124 may be formed directly above the substrate 102, or configured by an integrated circuited (IC) formed above a substrate different from the substrate 102 such as a semiconductor substrate mounted above the substrate 102. In FIG. 2, an example in which a chip including an IC (IC chip) is mounted above the substrate 102 as the drive circuit 124 is shown. FIG. 2 shows an example in which the drive circuit 124 runs along a first side 132, but a plurality of drive circuits 124 may be provided, for example, along the second side 134, the third side 136, and the fourth side 138.

The pixels 120 are connected to the drive circuit 124 by a wiring 202 which will be described later. A plurality of wirings 126 extend from the drive circuit 124 toward an end portion of the substrate 102. The wirings 126 are exposed at the end portion of the substrate 102 or the vicinity thereof to form the terminals 128. The terminals 128 are electrically connected to the connector 108, thereby electrically connecting the connector 108 to the drive circuit 124.

A power-receiving unit 162 is provided in the vicinity of the terminals 128. The power-receiving unit 162 is also a type of terminal and is connected to the connector 108. The power-receiving unit 162 is electrically connected to a low potential power line 206 transmitting a low potential power supply. One power-receiving unit 162 may be provided above the substrate 102, and as is shown in FIG. 2, two power-receiving units 162 may be provided so as to sandwich the terminals 128.

Here, the region from the side among the sides of the substrate 102 closest to the terminals 128 to the display region 122 is the peripheral region of the display device, and in the description hereinafter will be defined as, for example, the peripheral region 130. The peripheral region 130 is in contact with the display region 122. Therefore, the peripheral region 130 is arranged above the substrate 102, and includes a portion of the seal 116, the drive circuit 124, the wiring 126, the power-receiving unit 162, and the terminals 128. The seal 116 is provided so as to surround the display region 122, and seals the display region 122. Trap electrodes 222, 230 to be described later are arranged in the spaces between this seal. Further, the peripheral region of the outer side of the display region 122 may be called the external display region. The peripheral region 130 may also be called a terminal region, or a peripheral region of the terminal portion side. Both the terminal region and the peripheral region of the terminal portion side are included in the external display region.

[3. Pixels]

Figure 3:
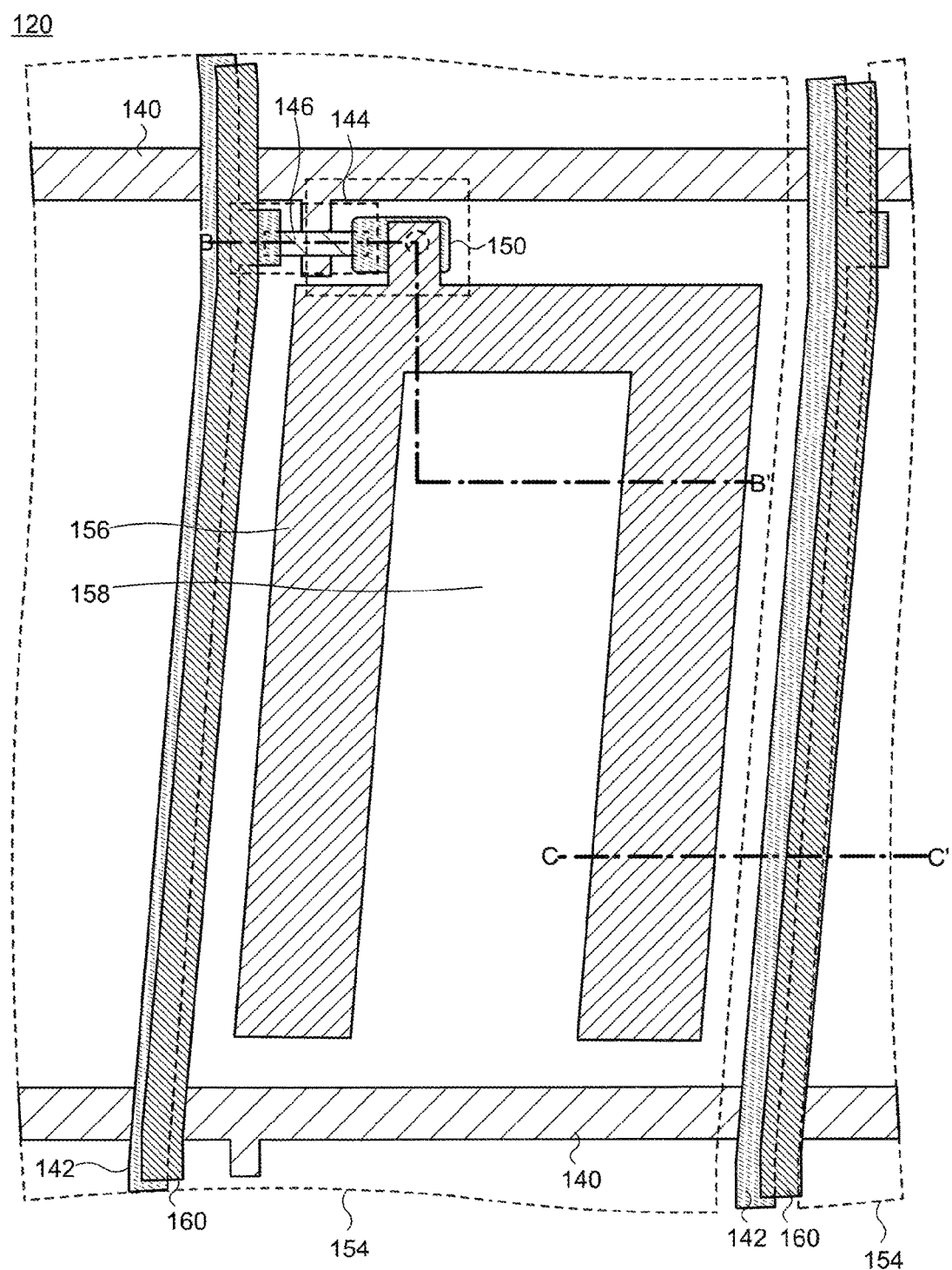
FIG. 3: Schematic top view of a display device of one embodiment of the present invention.

A schematic top view of a pixel 120 is shown in FIG. 3. A plurality of gate signal lines (scanning lines) 140 and video signal lines 142 are provided in the display region 122. Each of the plurality of gate signal lines 140 is electrically connected to the plurality of pixels 120 arranged in a direction in which the gate signal lines 140 extend. Similarly, each of the plurality of video signal lines 142 is electrically connected to the plurality of pixels 120 arranged in a direction in which the video signal lines 142 extend. The video signal lines 142 in FIG. 3 have a zig zag structure, while the video signal lines 142 may substantially extend linearly in the display region 122. Each pixel 120 is provided with at least one transistor 144. The transistor 144 includes a portion of the gate signal line 140 as a gate electrode, a semiconductor film 146, and a source electrode 150. A portion of the gate signal line 140 functions as a gate electrode 148 of the transistor 144, and a portion of the video signal line 142 functions as a drain electrode 152 of the transistor 144. The source electrode 150 and the drain electrode 152 of the transistor 144 may be interchanged by the direction of the current and the polarity of the transistor. Although not illustrated, the pixels 120 may further have semiconductor elements such as capacitor elements, other transistors, or the like.

The pixel 120 further has a common electrode 154 and a pixel electrode 156. The pixel electrode 156 may have a slit 158. The slit 158 is an open shape. The slit 158 is not limited to only one as is shown in FIG. 3, and a plurality of slits may be formed. As is shown in FIG. 3, the pixel electrode 156 is electrically connected to the transistor 144. To the video signal line 142 are provided signals corresponding to images, and the signals are applied to the pixel electrode 156 via the transistor 144.

The common electrodes 154 are arranged in a stripe shape in a direction in which the plurality of video signal lines 142 extends, and each common electrode 154 is shared by the plurality of pixels 120. In other words, each common electrode 154 is provided so as to cover the plurality of video signal lines 142. During the display period, a common potential is applied to the common electrode 154 functioning as an electrode for applying voltage to the liquid crystal layer 114. On the other hand, during the period in which the common electrode 154 functions as one of the electrodes of the touch panel (hereinafter written as sensing period), a fixed frequency (for example, several kHz to several tens of kHz) pulse voltage is applied, by which the common electrode 154 provides a function as a touch panel to the display device 100 in association with the Rx wiring 106. Therefore, the common electrode 154 is considered as one of the electrodes of the liquid crystal elements, and is also considered as the Tx wiring (Tx electrode) which is one of the wirings of the touch panel. Therefore, the display device 100 functions as a display device in which an in-cell type touch panel is built in.

As an optional structure, the pixels 120 may have a wiring 160 electrically connected to the common electrode 154. The wiring 160 extends over the video signal line in a direction in which the video signal line 142 extends, and may be shared by the plurality of pixels 120. When the common electrode 154 includes a conductive oxide transmitting visible light such as indium tin oxide (ITO) and indium zinc oxide (IZO), since these oxides have a higher resistance compared to a metal such as aluminum, copper, tungsten, titanium, and molybdenum, drops in voltage readily take place, and a large difference in potential between the pixels may occur. By providing the wiring 160 including a metal so as to be contact with the common electrode 154, the low conductivity of ITO and IZO can be complimented. Namely, the wiring 160 functions as a supplemental electrode and inhibits the occurrence of difference in potential between the pixels 120. The wiring 160 may be provided above the common electrode 154.

In FIG. 3, an example in which the common electrode 154 is arranged parallel to the video signal line 142 is shown. However, the common electrode 154 may be arranged parallel to the gate signal line 140. In this case, the Rx wiring 106 is provided so as to be parallel to the video signal line 142 (so as to be in a direction parallel to the long side of the counter substrate 104 in the example in FIG. 1A).

Figure 4:
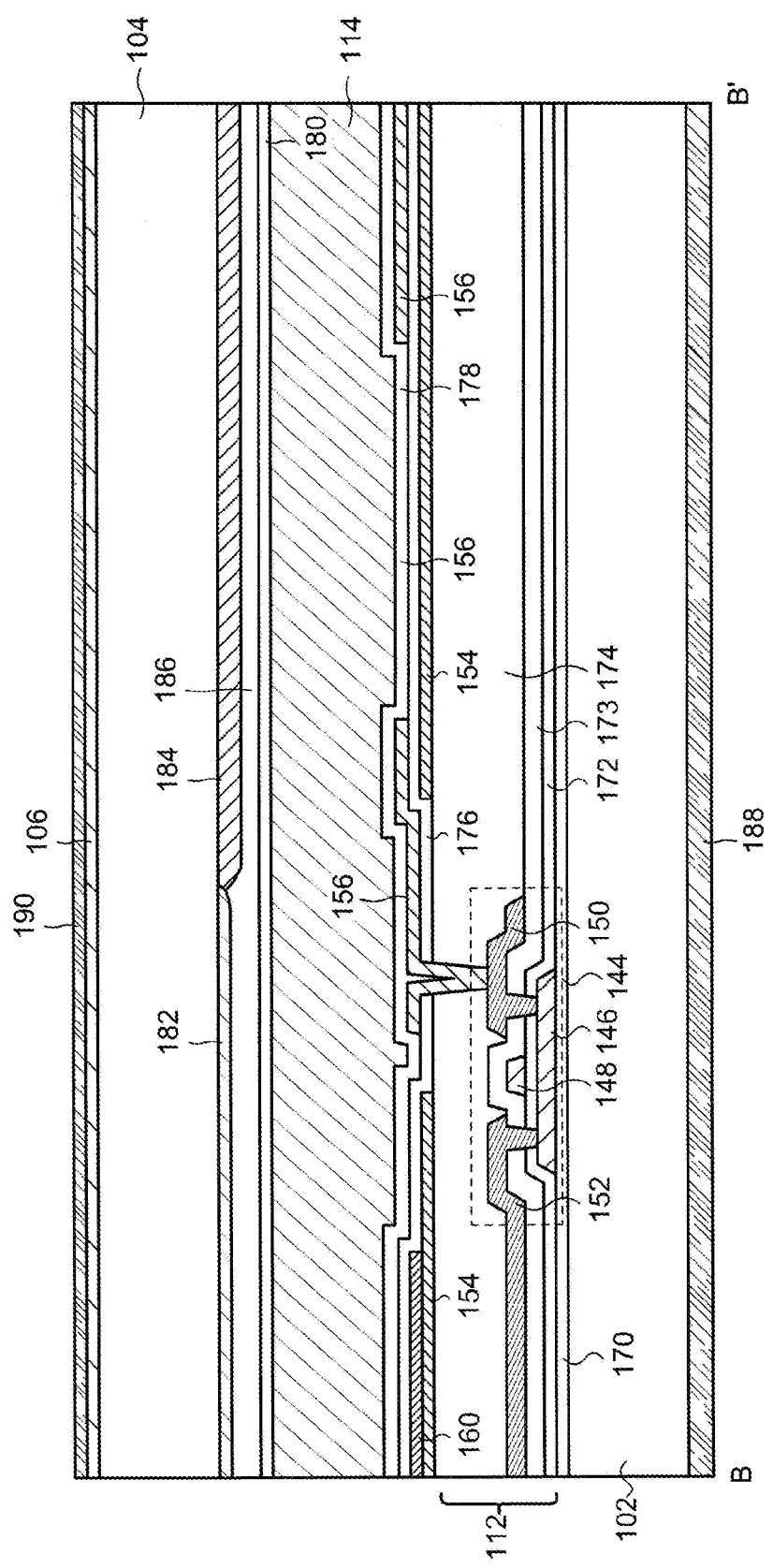
FIG. 4: Schematic cross-sectional view of a display device of one embodiment of the present invention.

A schematic view of the cross section taken along the dotted line B-B' in FIG. 3 is shown in FIG. 4. As is shown in FIG. 4, the transistor 144 is provided above the substrate 102 via an undercoat 170 which is an optional structure. The transistor 144 includes a semiconductor film 146, a gate insulating film 172, a gate electrode 148, an interlayer film 173, a source electrode 150, and a drain electrode 152. The transistor 144 shown in FIG. 4 is a top gate type transistor. However, the transistor 144 is not limited to having this structure, and the transistor 144 may also be a bottom gate type, and may have a structure in which a gate electrode is provided above and below the semiconductor film 146. There is no restriction on the vertical relationship between the semiconductor film 146 and the source electrode 150 and the drain electrode 152.

A planarization film 174 which is an insulating film is provided above the transistor 144, by which unevenness caused by the transistor 144 is absorbed, and a planar surface is provided above the planarization film 174. The common electrode 154 is provided above the planarization film 174.

The pixel 120 may further have a passivation film 176 covering the common electrode 154 and the planarization film 174. The passivation film 176 has a function for electrically separating the common electrode 154 and the pixel electrode 156. The pixel electrode 156 is provided above the planarization film 174 and the passivation film 176, and is electrically connected to the source electrode 150 at the opening formed in the planarization film 174, the passivation film 176, and the common electrode 154. A first orientation film 178 is further provided above the pixel electrode 156, and a liquid crystal layer 114 is formed thereover. By providing a difference in potential between the common electrode 154 and the pixel electrode 156, an electric field is formed in the liquid crystal layer 114 in a direction nearly parallel to the upper surface of the substrate 102. The liquid crystal molecules in the liquid crystal layer 114 are rotated by this electric field, by which the polarization plane of the polarized light passing through the liquid crystal layer 114 is rotated. Therefore, the display device 100 functions as an FFS (Fringe Field Switching) liquid crystal display device which is one structural example of a so-called IPS (In-Plane Switching) liquid crystal display device. However, the display device 100 is not limited to an IPS liquid crystal display device, and may also be a TN (Twisted Nematic) liquid crystal display device or a VA (Vertical Alignment) liquid crystal display device.

The counter substrate 104 is provided above the first orientation film 178 via the liquid crystal layer 114. A light shielding film (black matrix) 182 and a color filter 184, and an overcoat 186 covering the light shielding film 182 and the color filter 184 may be provided in the counter substrate 104.

The light shielding film 182 has a function shielding visible light, and may be provided so as to overlap the gate signal line 140 and the video signal line 142. The light shielding film 182 may be provided so as to overlap the transistor 144, the gate signal line 140, and the video signal line 142. As is understood from FIG. 3, when the light shielding film 182 is provided so as to overlap the gate signal line 140 and the video signal line 142, the light shielding film 182 may be recognized as one film having an opening. Therefore, the opening of the light-shielding film 182 corresponds to the display region of each pixel 120.

The color filter 184 is provided in order to provide color to the light emitted from each pixel 120, and overlaps the opening of the light shielding film 182. Therefore, the color filter 184 may be provided so as to overlap the pixel electrode 156 and the common electrode 154.

The counter substrate 104 further has a second orientation film 180 provided so as to be in contact with the liquid crystal layer 114. Similar to the first orientation film 178, the second orientation film 180 also has a function for orienting the liquid crystal molecules. Although not illustrated, a spacer for maintaining a constant distance between the substrate 102 and the counter substrate 104 may be added or formed between the substrate 102 and the counter substrate 104.

The display device 100 further has polarization plates 188, 190 below the substrate 102 and above the counter substrate 104, respectively. The polarization plates 188, 190 may be arranged so as to have a crossed Nichol prism relationship with each other. Although not illustrated, the display device 100 further has a backlight below the polarization plate 188. The backlight is arranged so as to radiate light to the substrate 102 side. Light emitted from the backlight and polarized by the polarization plate 188 passes through the liquid crystal layer 114, and at that time, the polarization plane is rotated by the liquid crystal layer 114. After that, a portion of the light is absorbed and colorized by the color filter 184, passes through the polarization plate 190, and is emitted to the outside.

Figure 5:
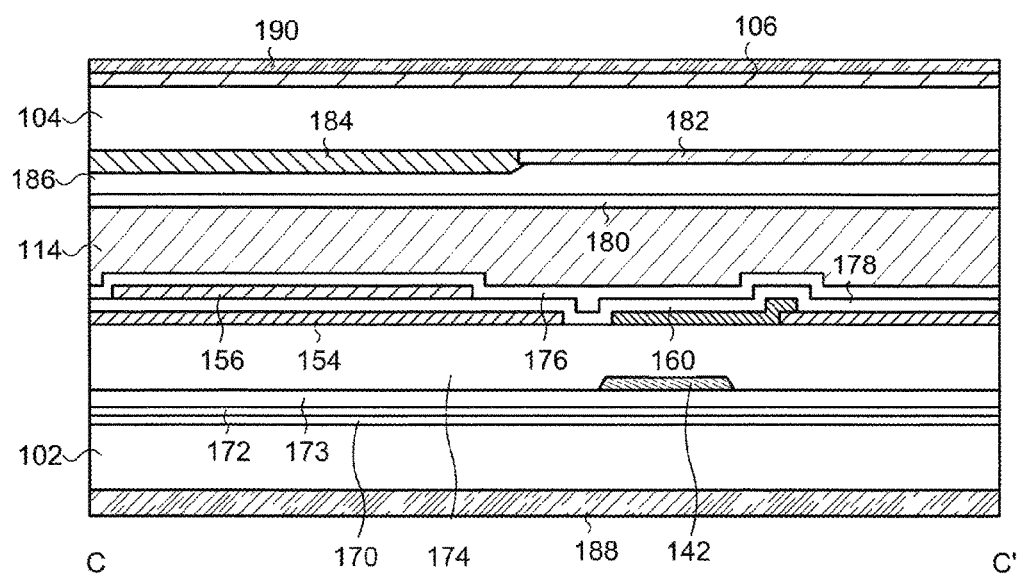
FIG. 5: Schematic cross-sectional view of a display device of one embodiment of the present invention.

A schematic view of the cross section taken along the dotted line C-C' in FIG. 3 is shown in FIG. 5. A state in which a wiring 160 is provided so as to cover a portion of the common electrode 154 and the common electrode 154 is electrically connected to the wiring 160 is shown in this cross section. The wiring 160 may include a metal, and may have a lower resistance than the common electrode 154. Hence, the wiring 160 functions as a supplemental electrode complementing the comparatively low conductivity of the common electrode 154. A light shielding film 182 may be provided above the wiring 160.

[4. Touch Panel Function]

As described above, the common electrode 154 and the Rx wiring 106 may be arranged in a stripe form so as to intersect with each other. For example, the common electrode 154 is arranged parallel to the direction in which the video signal line 142 extends, and the Rx wiring 106 is arranged in a direction perpendicular to the direction in which the common electrode 154 extends so as to overlap with the display region 122. The liquid crystal layer 114 between the common electrode 154 and the Rx wiring 106, the first orientation film 178, the second orientation film 180, and the like may function as a dielectric, and as a result, capacitance is formed between the common electrode 154 and the Rx wiring 106.

As described above, a fixed frequency pulse voltage is applied to the pixel electrode 156 during a sensing period. In a state in which a person's finger is not touching and a state in which it is touching, since the apparent capacitance is different, the current flowing between the common electrode 154 and the Rx wiring 106 in response to a change in capacitance is also different. As a result, the potential of the Rx wiring 106 also changes depending on whether or not there is touch. When the potential of the Rx wiring 106 is decreased below the threshold value, it is determined that touch is performed. In this way, touch detection is performed.

[5. Peripheral Region 130]

Figure 6:
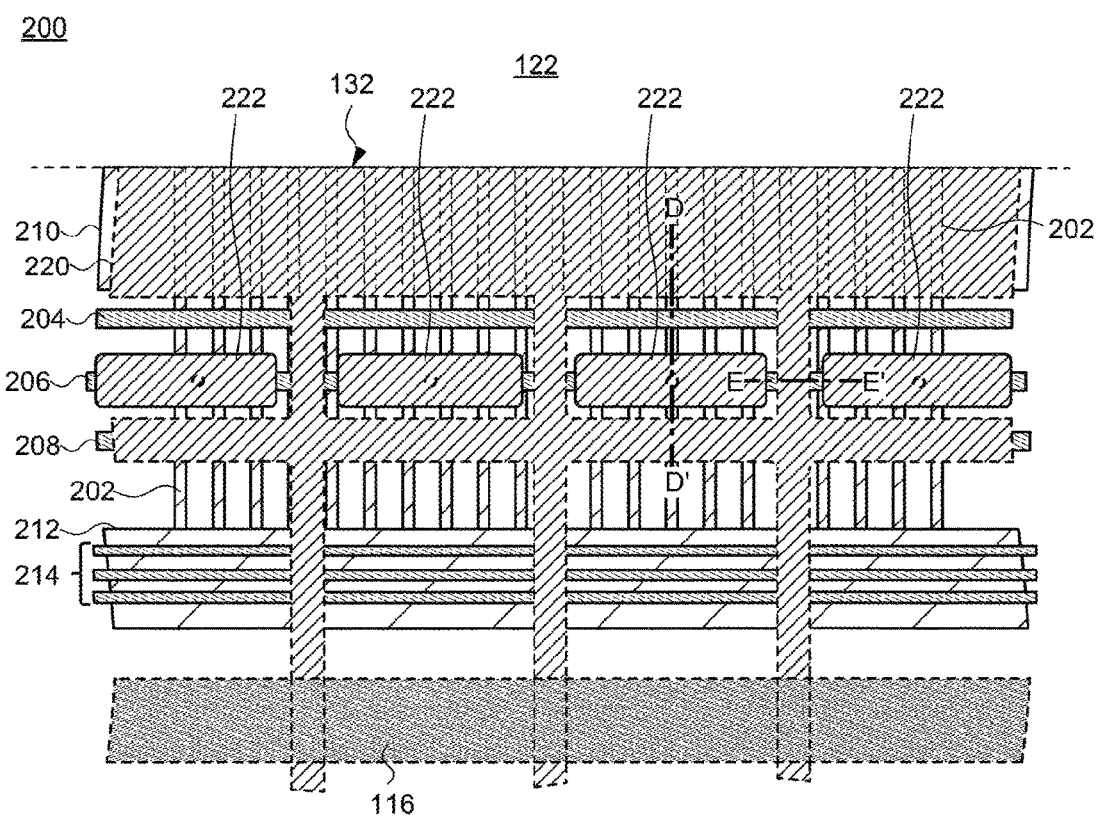
FIG. 6: Schematic top view of a display device of one embodiment of the present invention.
Figure 7A:
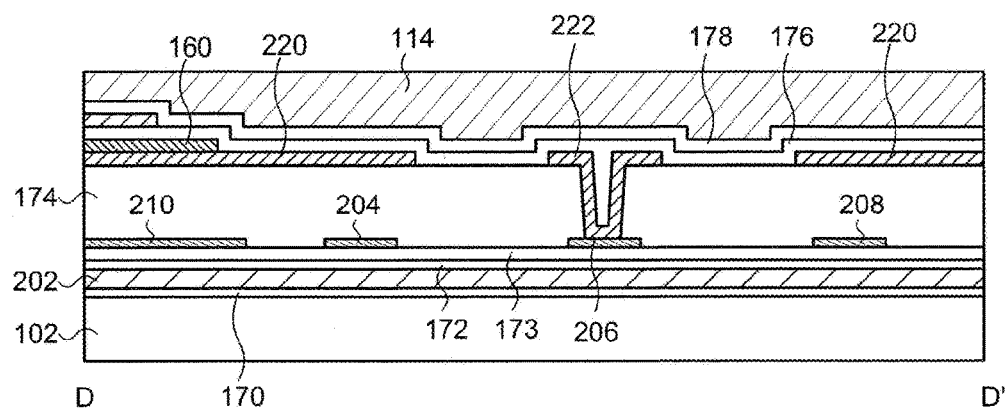
FIG. 7A and FIG. 7B: Schematic cross-sectional view of a display device of one embodiment of the present invention.
Figure 7B:
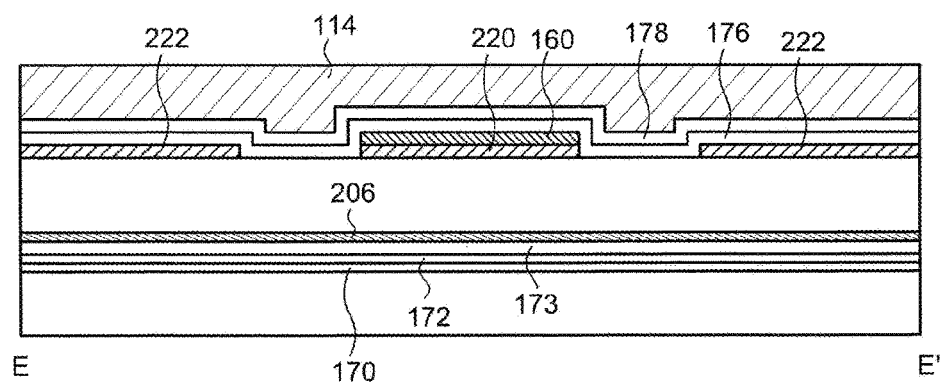

A schematic top view of the region 200 shown in FIG. 2 is shown in FIG. 6, and a schematic cross-sectional view taken along the dotted lines D-D', E-E' in FIG. 6 are shown in FIG. 7A, FIG. 7B, respectively. The region 200 is a portion of the peripheral region 130, and is arranged between the display region 122 and the terminals 128, or between the display region 122 and the drive circuit 124. In FIG. 6, the region between the display region 122 and the seal 116 is illustrated. In FIG. 7A, FIG. 7B, structures above the liquid crystal layer 114 are omitted.

As is shown in FIG. 2, FIG. 6, and FIG. 7A, a Tx drive circuit 210 and an analog switch 212 are provided between the display region 122 and the seal 116. These circuits are arranged parallel to the first side 132 of the display region 122. The Tx drive circuit 210 has a function as switching the connection of the common electrode 154, and during the display period, is configured so as to be connected to a common potential power line (not shown) and supply a common potential to the common electrode 154, and during the sensing period, supply a pulse potential to the common electrode 154.

An analog switch line 214 transmitting signals for controlling the analog switch 212 is provided above the analog switch 212. The analog switch line 214 extends in a direction parallel to the first side 132. Between the analog switch 212 and the Tx drive circuit 210, a control wiring 204 transmitting signals for controlling the Tx drive circuit 210, an xSELC (VGH) 204, 208, and a low potential power line 206 are provided as wirings extending in a direction parallel to the first side 132, that is to say, extending in a direction parallel to the gate signal line 140. These wirings may be formed at the same time as the formation of the source electrode 150 and the drain electrode 152, and therefore may be in the same layer as the source electrode 150 and the drain electrode 152.

The wiring 202 extends from the display region 122 including the plurality of pixels 120 to the analog switch 212. The wiring 202 is electrically connected to the video signal line 142 of the pixels 120, and at least one portion is in the same layer as the gate signal line 140. For example, as is shown in FIG. 7A, among the wirings 202, at least a portion overlapping the low potential power line 206 and the control wirings 204, 208 may be formed at the same time as the formation of the gate signal line 140 so as to be in the same layer as the gate signal line 140. This structure allows the wiring 202 to exist in a different layer than the low potential power line 206 and the control wirings 204, 208, by which without conducting with these wirings, the video signal line 142 and the analog switch 212 can be electrically connected.

The Tx drive circuit 210, the control wirings 204, 208, and the low potential power line 206 are covered by the planarization film 174, and a shield electrode 220 is provided above the Tx drive circuit 210 and the control wirings 204, 208 via the planarization film 174. Since the shield electrode 220 may be formed at the same time as the common electrode 154, the shield electrode 220 may be in the same layer as and separate from the common electrode 154. The shield electrode 220 covers the Tx drive circuit 210, and has a function shielding the electric field generated as a result of the operation of the Tx drive circuit 210. The shield electrode 220 further covers the control wiring 208, and has a function shielding the electric field generated by the control wiring 208. A wiring 160 may be provided above the shield electrode 220 so as to cover a portion thereof (see FIG. 7A).

As is shown in FIG. 6, the region 200 further has a plurality of trap electrodes 222 covering the low potential power line 206 and arranged in an island shape. The trap electrodes 222 are arranged so as to extend between the analog switch 212 and the display region 122. A portion of the shield electrode 220 extends between adjacent trap electrodes 222 (FIG. 7B). The width of the trap electrodes 222 may be greater than the width of the low potential power line 206. As is shown in FIG. 7A, the trap electrodes 222 are electrically connected to the low potential power line 206 via the opening provided in the planarization film 174 extending from the display region 122. Therefore, the same potential as the low potential power line 206 is applied to the trap electrodes 222. The trap electrodes 222 may be formed at the same time as the common electrode 154 and separated in the same layer, or may be formed at the same time as the pixel electrode 156 and separated in the same layer. Alternatively, the trap electrodes 222 may have a stacked structure including a first layer in the same layer as the common electrode 154 and a second layer in the same layer as the pixel electrode 156. The trap electrodes 222 may be covered by the first orientation film 178 and the passivation film 176 extending from the display region 122.

The low potential power line 206 is connected to the power-receiving unit 162 (see FIG. 2). When driving the display device 100, since a low voltage (VSS) is applied to the low potential power line 206, the same potential as the low potential power wiring 206, that is to say, VSS is applied to the trap electrodes 222. On the other hand, a low potential VSS or a high potential (VDD) is applied to the analog switch line 214. When the analog switch line 214 has a high potential and the trap electrodes 222 have a low potential, the former can block ions (for example, cations) that pass through the seal 116 from the outer portion and penetrate the liquid crystal layer 114. On the other hand, the latter may capture ions by Coulomb force. Therefore, reduction of the voltage applied to the liquid crystal layer 114 by ionic impurities can be prevented, and as a result, the generation of display defects of the display device 100 may be inhibited, and a high-quality display becomes possible.

This effect is particularly beneficial when the display device is driven by a low frequency (low frequency drive). One frame of a normal display device is 1/60 second, and for every 1/60 second VDD is provided from the gate signal line 140 to the gate electrode 148 of each transistor 144 to turn on the transistor 144, and a potential corresponding to the video signal is provided to the pixel electrode 156 (writing operation). Namely, writing is performed at a frequency of 60 Hz, and writing is also performed at this frequency when a still image is displayed. This is because the leak current of a normal transistor, for example a transistor having a silicon semiconductor, is large, and the potential of the pixel electrode 156 cannot be maintained throughout a plurality of frames.

On the other hand, when an oxide semiconductor is used, for example, in the semiconductor film 146 of the transistor 144, the current (leak current) flowing between the source electrode 150 and the drain electrode 152 when the transistor 144 is off can be smaller. Hence, the potential transmitted from the video signal line 142 to the pixel electrode 156 via the transistor 144 may be maintained for a long period of time. Therefore, for example when a still image is displayed, writing at every 1/60 second becomes unnecessary, and the writing number may be reduced. Specifically, it is possible to write at a frequency of 30 Hz and 10 Hz, or above 1 Hz. In this case, writing is performed at one frame (writing frame), and writing is not performed at the following plurality of frames (halt frame). Therefore, it is possible to substantially reduce power consumption.

At such a low frequency driving, a continuous high potential is applied to the analog switch line 214 at a halt frame. Thus, although the analog switch line 214 may effectively shield ions penetrating from the outside, the capturing function is small, causing the so called black spot display defect. However, in the display device 100, since the trap electrodes 222 are arranged in the vicinity of the liquid crystal layer 114 and a low potential may be applied thereto, ions in the liquid crystal layer 114 can be captured and the diffusion of ions into the display region 122 can be prevented. Accordingly, the generation of display defects in the display device 100 may be inhibited, and a high-quality display becomes possible.

[6. Peripheral Region]

Figure 8:
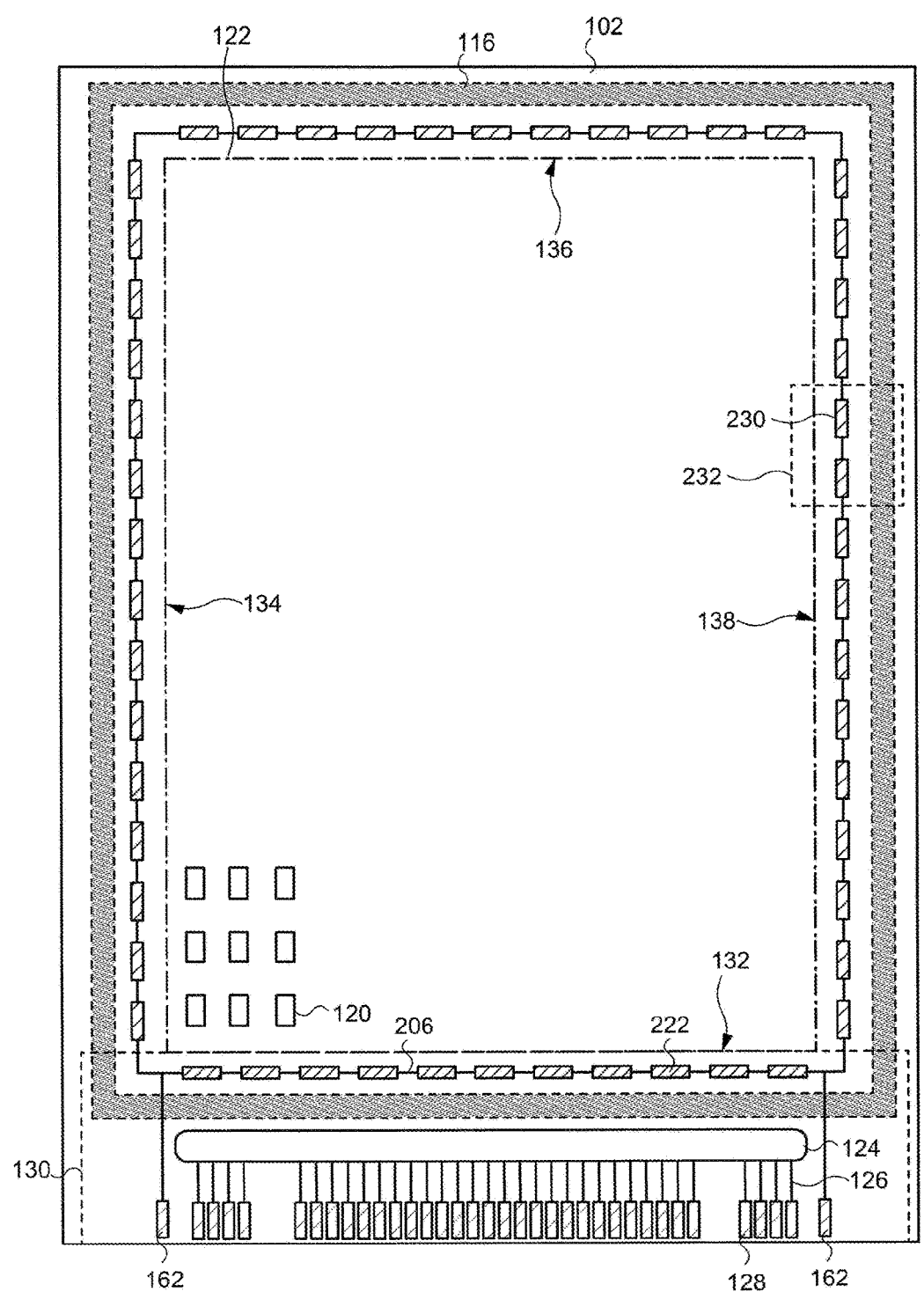
FIG. 8: Schematic top view of a display device of one embodiment of the present invention.

As is shown in FIG. 8, the low potential power line 206 may be arranged so as to surround the display region 122. In this case, trap electrodes 230 electrically connected to the low potential power line 206 may be provided along a side other than the first side 132 of the display region 122. In an example shown in FIG. 8, along with the plurality of trap electrodes 222 arranged along the first side 132, the plurality of trap electrodes 230 are each arranged parallel to the second side 134, the third side 136, and the fourth side 138 (along the second side 134, the third side 136, and the fourth side 138). Therefore, the display region 122 is surrounded by the plurality of trap electrodes 222 and the plurality of trap electrodes 230.

Figure 9:
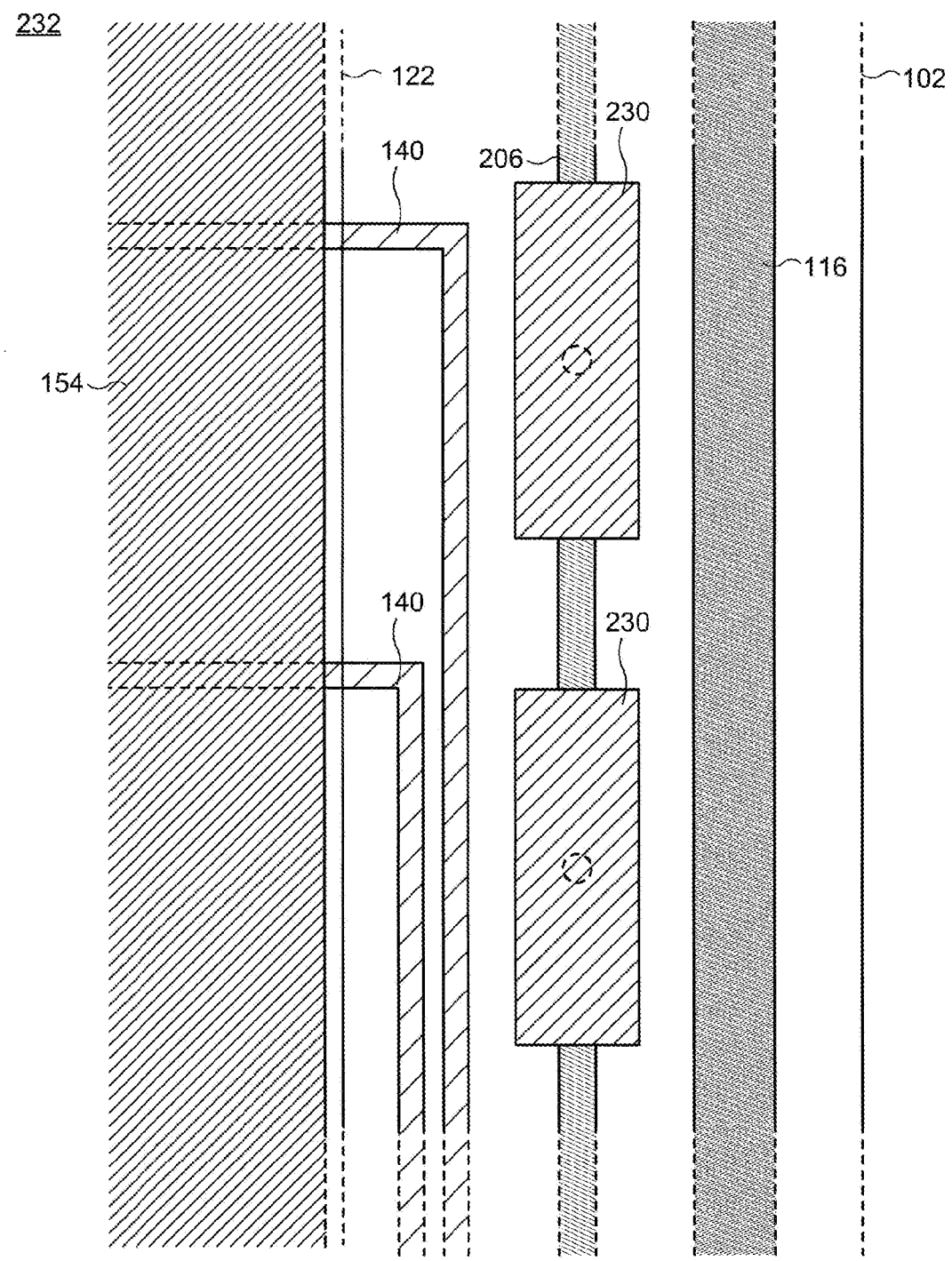
FIG. 9: Schematic top view of a display device of one embodiment of the present invention.

A schematic top view of the region 232 shown in FIG. 8 is shown in FIG. 9. As is shown in FIG. 8, FIG. 9, the plurality of trap electrodes 230 and the low potential power line 206 are arranged inside the region surrounded by the seal 116 or on the outer side of the display region 122. The plurality of trap electrodes 230 are provided above the low potential power line 206 so as to overlap the low potential power line 206. The width of each of the plurality of trap electrodes 230 may be greater than the width of the low potential power line 206. The trap electrodes 230 may be formed at the same time as the pixel electrode 156, and therefore may be separated from and in the same layer as the pixel electrode 156.

Similar to the trap electrodes 222, since the trap electrodes 230 and the low potential power line 206 are electrically connected at the opening provided in the planarization film 174 (in FIG. 9, the circular dotted line), so VSS is applied to the trap electrodes 230. For this reason, the trap electrodes 230 may capture the ions in the liquid crystal layer 114, and display defects caused by display speckle may be more effectively inhibited in association with the ion capturing function of the trap electrodes 222.

Figure 10:
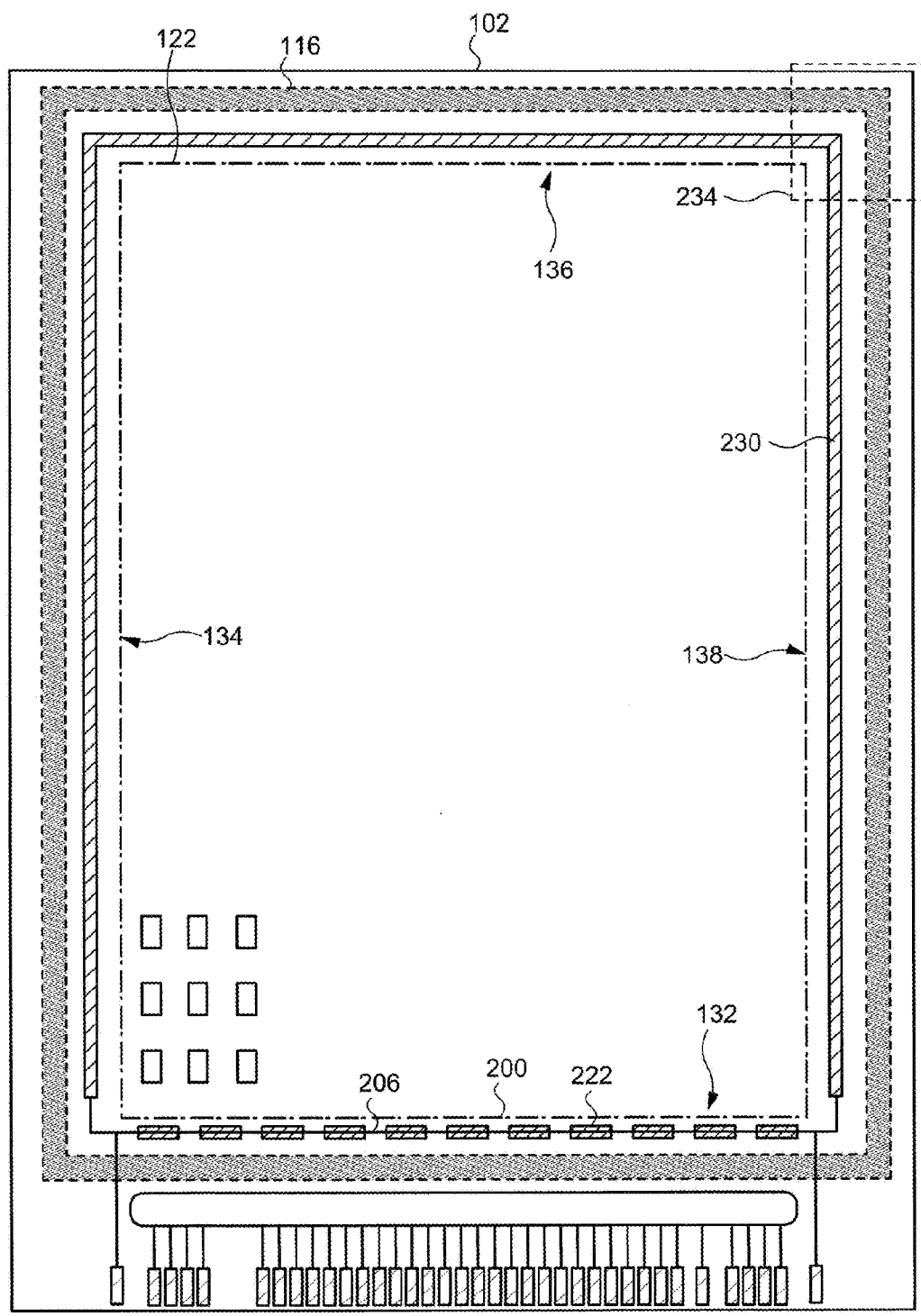
FIG. 10: Schematic top view of a display device of one embodiment of the present invention.

Without providing a plurality of trap electrodes 230, single trap electrode 230 may be arranged so as to continuously run along the second side 134, the third side 136, and the fourth side 138. Specifically, as is shown in FIG. 10, a plurality of trap electrodes 222 may be arranged between the first side 132 and the seal 116, and in the regions between the second side 134, the third side 136, and the fourth side 138, and the seal 116, single trap electrode 230 may be provided continuously throughout these regions. The low potential power line 206 may also be provided so as to surround the display region 122. The trap electrode 230 overlaps the low potential power line 206 and is electrically connected to the low potential power line 206. In this case, as is exemplarily shown in FIG. 11 which is an enlarged image of the region 234 shown in FIG. 10, the electrical connection of the low potential power line 206 and the trap electrode 230 may be carried out in the opening provided in the corner or the bent portion of the low potential power line 206 (the circular dotted line in FIG. 11). The number of openings is not limited to one, and a plurality of openings may be formed.

Figure 11:
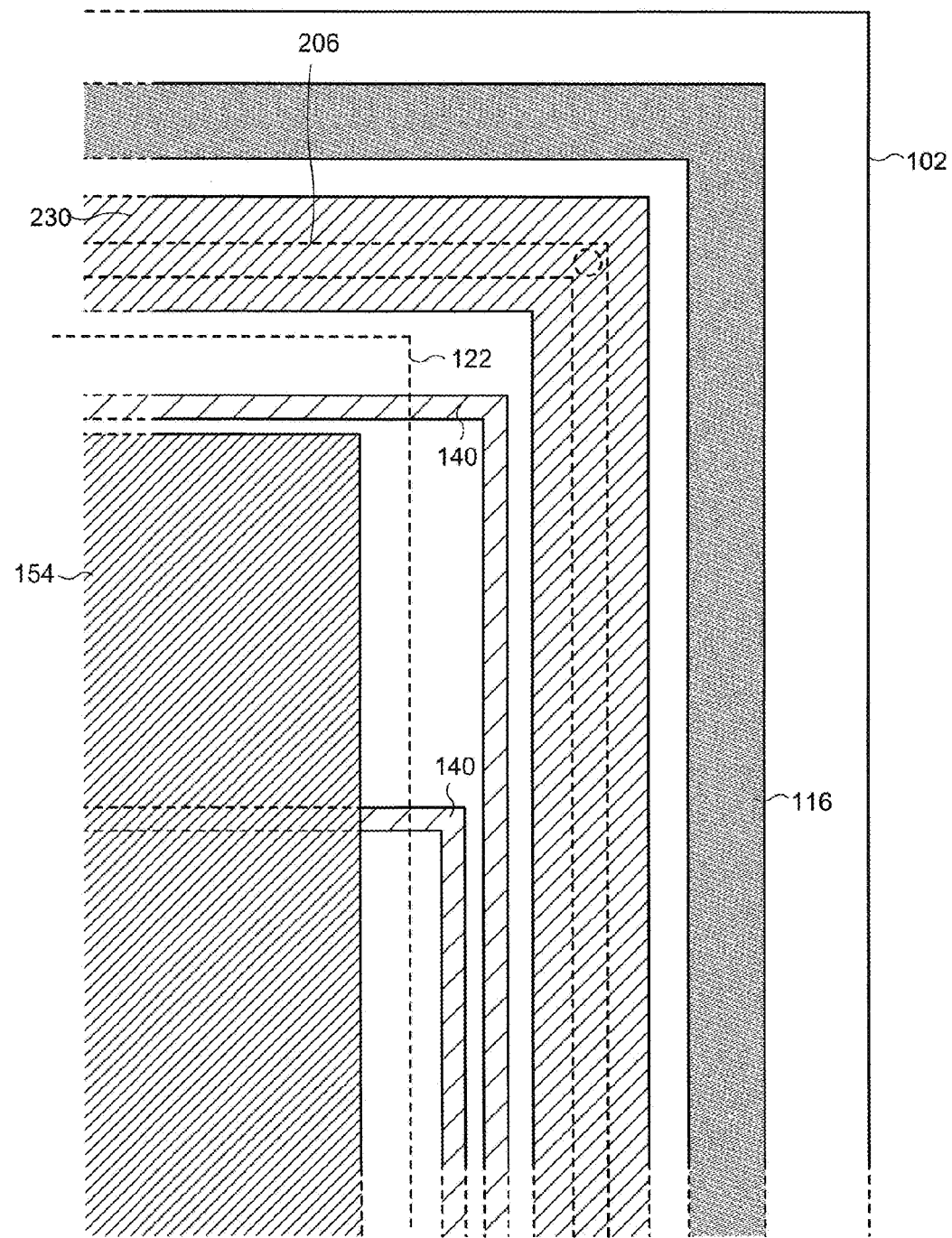
FIG. 11: Schematic top view of a display device of one embodiment of the present invention.

Similar to the structures shown in FIG. 8, FIG. 9, in the structures shown in FIG. 10 and FIG. 11, the display region 122 is surrounded by the plurality of trap electrodes 222 arranged along the first side 132 as well as the trap electrode 230 having a continuous structure along the second side 134, the third side 136, and the fourth side 138. Therefore, capture of ions may be effectively performed, and the display device 100 in which display defects are inhibited may be provided.

Embodiment 2

In the present embodiment, the manufacturing method of the display device 100 will be described using FIG. 12A through FIG. 18C. FIG. 12A, FIG. 13A, FIG. 14A, FIG. 15A, FIG. 16A, FIG. 17A, and FIG. 18A correspond to the cross section taken at the dotted line B-B' of FIG. 3, and FIG. 12B, FIG. 13B, FIG. 14B, FIG. 15B, FIG. 16B, FIG. 17B, and FIG. 18B correspond to the cross section taken along the dotted line D-D' of FIG. 6, and FIG. 12C, FIG. 13C, FIG. 14C, FIG. 15C, FIG. 16C, FIG. 17C, and FIG. 18C correspond to the cross section taken along the dotted line E-E' of FIG. 6. Descriptions of structures similar to those of Embodiment 1 will be omitted.

[1. Pixel Layer 112]

Figure 12A:
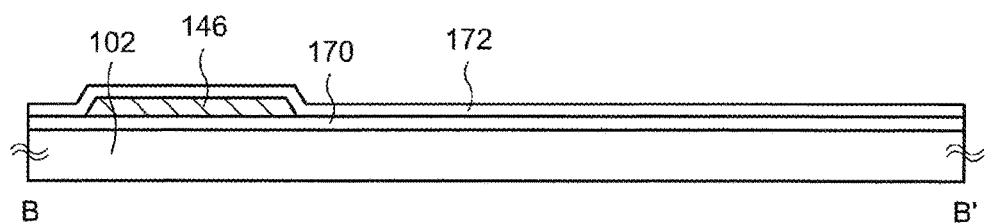
FIG. 12A to FIG. 12C: Diagram describing a manufacturing method of a display device of one embodiment of the present invention.
Figure 12B:
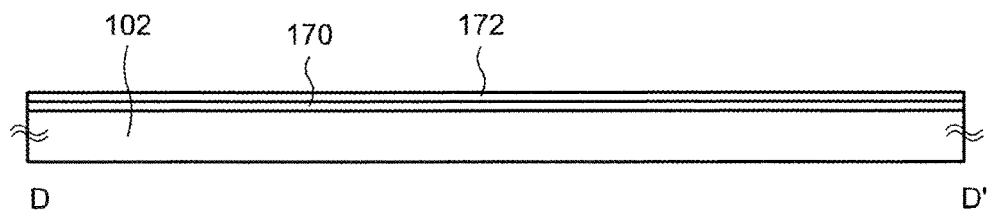
Figure 12C:
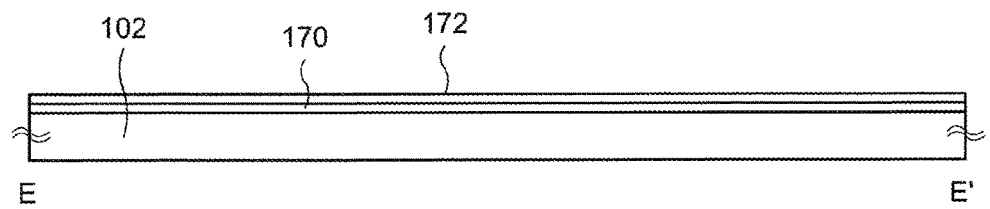

As is shown in FIG. 12A through FIG. 12C, an undercoat 170 is formed above the substrate 102. The substrate 102 supports the transistor 144, the common electrode 154, the pixel electrode 156, the liquid crystal layer 114, and the like. Therefore, the substrate 102 may have heat resistance to the process temperature and chemical stability to the chemicals used during the process for each structure formed above the substrate 102. Specifically, the substrate 102 may include glass and quartz, or ceramics. The substrate 102 may be a flexible resin substrate. A resin substrate may include macromolecular materials such as a polyimide, a polyamide, and a polycarbonate. The substrate 102 preferably allows visible light to pass therethrough.

The undercoat 170 is a film having a function preventing impurities such as alkali metals from diffusion from the substrate 102 to the transistor 144, the liquid crystal layer 114, and the like, and may include an inorganic insulator such as silicon nitride, silicon oxide, silicon oxide nitride, and silicon oxynitride. The undercoat 170 may be formed by applying a chemical vapor deposition method (CVD method), a sputtering method, or the like so as to have a single layer or a stacked layer structure. However, the undercoat 170 is an optional structure, and does not necessarily have to be provided.

Next, the semiconductor film 146 is formed. The semiconductor film 146 may, for example, include a group 14 element such as silicon or an oxide semiconductor. As an oxide semiconductor, a group 13 element such as indium and gallium may be included, and a mixed oxide of indium and gallium (IGO) is given as a typical example. The oxide semiconductor may further include a group 12 element, and as an example, a mixed oxide including indium, gallium, and zinc (IGZO) is given. Crystallinity of the semiconductor film 146 is not limited, and may be monocrystalline, polycrystalline, microcrystalline, or amorphous. This morphology may be mixed in the semiconductor film 146.

When the semiconductor film 146 includes silicon, the semiconductor film 146 may be formed by using silane gas and the like as raw materials with a CVD process. The formed amorphous silicon may be crystalized by a heating treatment or irradiation of light such as a laser and the like.

The semiconductor film 146 including an oxide semiconductor may be formed using a sputtering method. In this case, the film formation may be performed in an environment including oxygen gas, for example in an environment in which argon and oxygen gas are mixed. At that time, the partial pressure of argon may be less than the partial pressure of oxygen gas. The power source applied to the target may be a direct current power source or an alternating current power source, and may be determined by the shape and composition and the like of the target. A mixed oxide including indium, gallium, and zinc ($In_aGa_bZn_cO_d$) may be used as a target. Here, a, b, c, d are real numbers greater than 0, and are not limited to integers. Therefore, when it is assumed that each element exists as the most stable ion, the composition described above is not necessarily limited to an electrically neutral composition. As an example of the composition of the target, $InGaZnO_4$ is given, but it is not limited to this configuration, and another appropriate selection may be made.

After the semiconductor film 146 including an oxide semiconductor is formed, a heating treatment (anneal) may be performed for the semiconductor film 146. The heating treatment may be performed before or after patterning the semiconductor film 146. Since the dimensions of the semiconductor film 146 may become smaller (shrink) due to the heating treatment, the heating treatment is preferably performed before patterning.

The heating treatment may be performed in the presence of nitrogen, dry air, or the atmosphere at a normal pressure or at a reduced pressure. The heating temperature may be selected within a range of 250° C. to 500° C., or 350° C. to 450° C., and the heating time may be selected within a range of 15 minutes to 1 hour, but the heating treatment may be performed outside of these ranges. Oxygen is introduced or migrated to the oxygen defect of the semiconductor film 146 by this heating treatment, and a semiconductor film 146 with a more well-defined structure, fewer crystal defects, or higher crystallinity is obtained. As a result, a transistor 144 having a low leak current can be obtained, and a low frequency drive can be realized.

Next, the gate insulating film 172 is formed so as to cover the semiconductor film 146 (FIG. 12A). The gate insulating film 172 may have either a single layer structure or a stacked layer structure, and may include silicon oxide and silicon nitride, silicon oxynitride, silicon nitride oxide, and the like. The gate insulating film 172 may be formed in the same process as the undercoat 170. The gate insulating film 172 may be provided not only in the display region 122, but also in the peripheral region 130 (FIG. 12B, FIG. 12C).

Figure 13A:
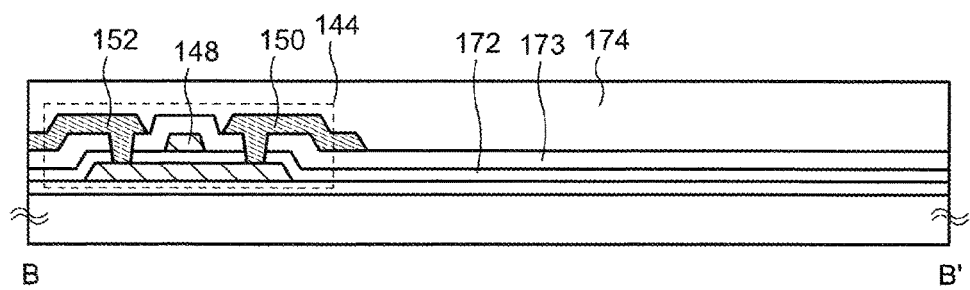
FIG. 13A to FIG. 13C: Diagram describing a manufacturing method of a display device of one embodiment of the present invention.
Figure 13B:
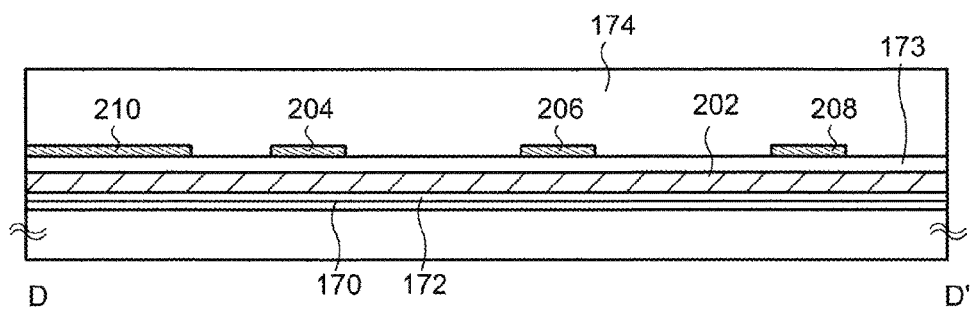
Figure 13C:
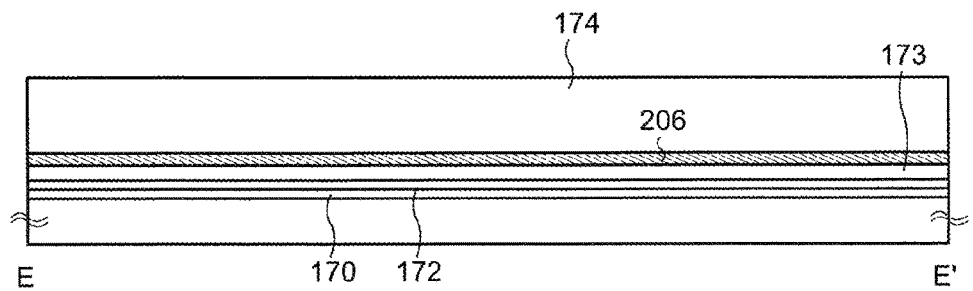

Next, as is shown in FIG. 13A to FIG. 13C, the gate signal line 140 including the gate electrode 148 and the wiring 202 are formed using a sputtering method or a CVD method. These wirings may be formed using a metal such as titanium, aluminum, copper, molybdenum, tungsten, and tantalum, or an alloy thereof so as to have a single layer or stacked layer structure. For example, a layered structure of molybdenum and tungsten, or a structure in which a metal with high conductivity such as aluminum and copper is sandwiched by a metal having comparatively high melting points such as titanium, tungsten, molybdenum, and the like, may be used.

Then, an interlayer film 173 is formed so as to cover the gate electrode 148. The interlayer film 173 may also include silicon oxide, silicon nitride, silicon oxynitride and silicon nitride oxide, and may be formed with the same method as the undercoat 170. The interlayer film may be provided not only in the display region 122, but also in the peripheral region 130 (FIG. 13B, FIG. 13C).

Next, in addition to the source electrode 150 and the drain electrode 152, the low potential power line 206, the control wirings 204, 208, and the like in the same layer as the source electrode 150 and the drain electrode 152 are formed (FIG. 13A through FIG. 13C). These wirings, similar to the gate electrode 148, may have either a single layer structure or a stacked layer structure. As the stacked structure, for example, a structure in which aluminum is sandwiched by titanium and the like is given. These wirings may also be formed by the same method as that of the formation of the gate electrode 148. The transistor 144 is formed by the steps above.

After that, the planarization film 174 is formed so as to cover the transistor 144, the low potential power line 206, and the control wirings 204, 208 (FIG. 13A through FIG. 13C). The planarization film 174 may be formed with an organic insulator. A macromolecular material such as an epoxy resin, an acrylic resin, a polyimide, a polyamide, a polyester, a polycarbonate, and a polysiloxane is given as an organic insulator, and may be formed by a wet-type film forming method such as a spin coating method, a dip-coating method, an inkjet method, or a printing method and the like.

Figure 14A:
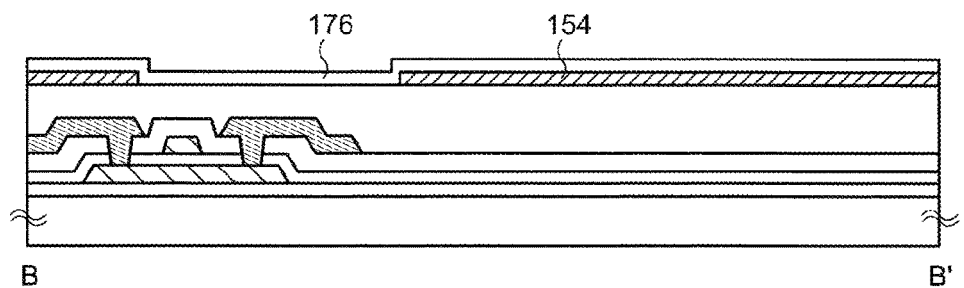
FIG. 14A to FIG. 14C: Diagram describing a manufacturing method of a display device of one embodiment of the present invention.
Figure 14B:
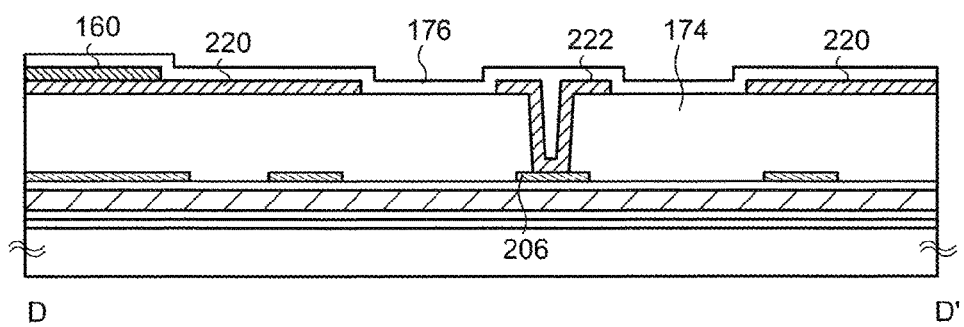
Figure 14C:
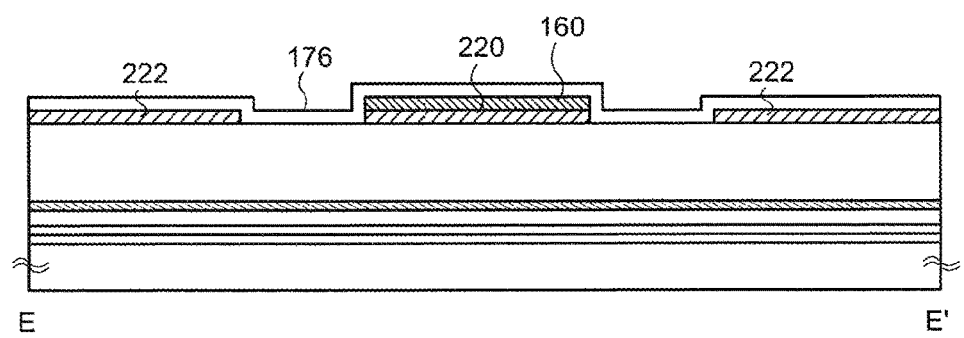

Next, etching is performed on the planarization film 174, and an opening exposing the low potential power line 206 is formed (FIG. 14B). The opening may be formed by performing plasma etching in gas including, for example, a fluorine-containing hydrocarbon. Then, in addition to the common electrode 154, the trap electrode 222 and the shield electrode 220 in the same layer as the common electrode 154 are formed using a sputtering method or a CVD method (FIG. 14A to FIG. 14C). The trap electrode 222 is formed so as to cover the opening described above, by which the trap electrode 222 is electrically connected to the low potential power line 206. The common electrode 154, the trap electrode 222, and the shield electrode 220 may be formed using a conductive oxide through which visible light passes such as ITO and IZO and using a sputtering method or the like. Before forming the common electrode 154, the trap electrode 222, and the shield electrode 220 including a conductive oxide, a metal thin film including a metal such as titanium, molybdenum, and tungsten and having a thickness which allows visible light to pass therethrough may be formed. In this case, the low potential power line 206 and the trap electrode 222 are connected via the metal thin film.

Then, the wiring 160 and the wirings in the same layer as the wiring 160 are formed. For example, the wiring 160 may be formed so as to cover the shield electrode 220. The wiring 160 may be formed by a CVD method or a sputtering method. Similar to the gate electrode 148, the source electrode 150, and the drain electrode 152, the wiring 160 may include a variety of metals. For example, a structure in which a metal with a high melting point such as titanium, tungsten, and molybdenum sandwich a high conductivity metal such as aluminum and copper may be used.

Next, the passivation film 176 is formed so as to cover the common electrode 154, the trap electrode 222, and the shield electrode 220 (FIG. 14A to FIG. 14C). The passivation film 176 may also include the same materials as the undercoat 170 and the gate insulating film 172, and typically includes an inorganic compound containing silicon such as silicon nitride. The passivation film 176 may also have either a single layer structure or a stacked layer structure.

Figure 15A:
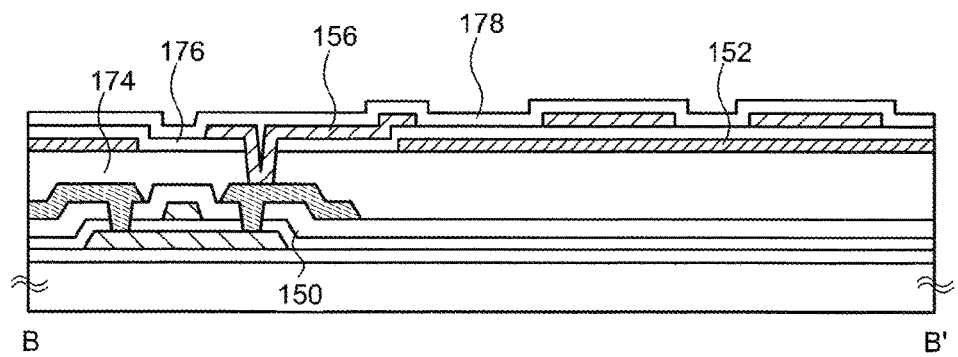
FIG. 15A to FIG. 15C: Diagram describing a manufacturing method of a display device of one embodiment of a present invention.

Then, etching is performed on the passivation film 176 and the planarization film 174, and an opening exposing the source electrode 150 is formed (FIG. 15A). Next, the pixel electrode 156 and the film in the same layer as the pixel electrode 156 are formed (FIG. 15A). For example, the trap electrodes 230 shown in FIG. 8 and FIG. 10 are formed in this step. The pixel electrode 156 is formed so as to cover the opening, by which the pixel electrode 156 and the source electrode 150 are connected.

Figure 15B:
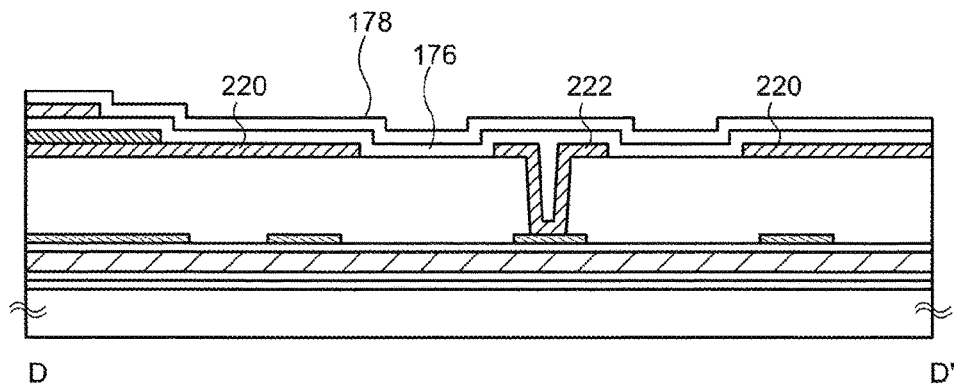
Figure 15C:
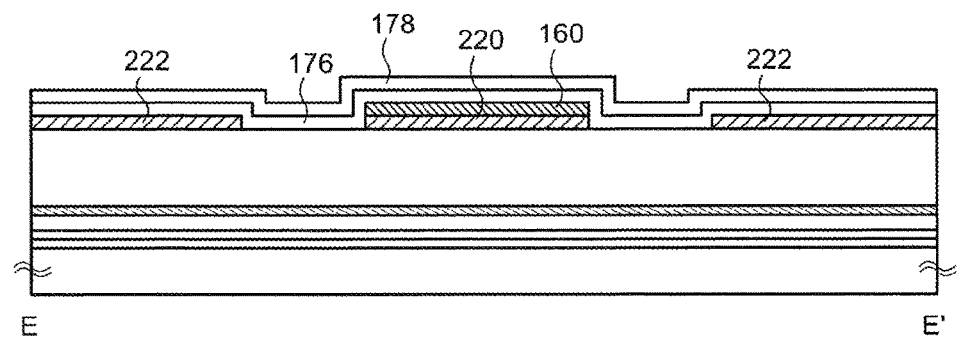

Then, the first orientation film 178 is formed (FIG. 15A to FIG. 15C). The first orientation film 178 may include a macromolecule such as a polyimide or a precursor thereof, a polyamide, and a polyester, and may be formed using a wet-type film formation method or a lamination method. A physical rubbing process may be performed on the first orientation film 178. Photo-orientation processing may also be performed instead of a rubbing process. Specifically, after the first orientation film 178 or a precursor thereof is applied, light may be applied to the substrate 102, by which photoreaction (cross-linking, degradation, and the like) occurs, and anisotropy is imparted to the surface of the first orientation film 178. The initial orientation of the liquid crystal molecules is controlled by this anisotropy. The pixel layer 112 is formed by the above steps.

[2. Counter Substrate]

Figure 16A:
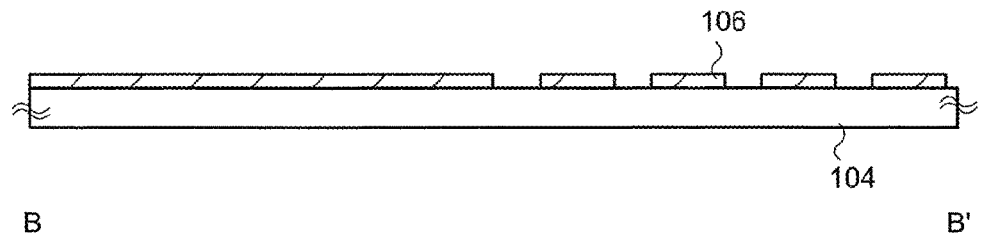
FIG. 16A to FIG. 16C: Diagram describing a manufacturing method of a display device of one embodiment of the present invention.
Figure 16B:
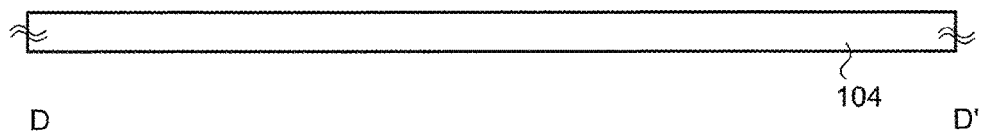
Figure 16C:
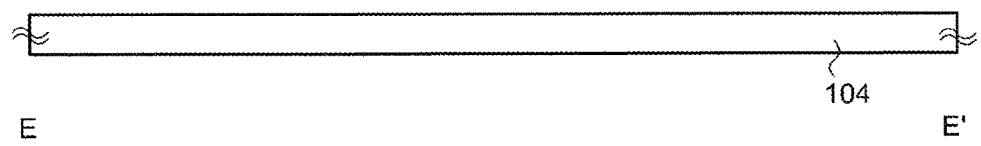

The Rx wiring 106 is formed above the counter substrate 104 (FIG. 16A). The counter substrate 104 may include the same material as the substrate 102. The Rx wiring 106 is formed in a stripe shape as is shown in FIG. 1A and FIG. 1B in the region overlapping the display region 122 on the counter substrate 104. The Rx wiring 106 may be not formed above the peripheral region 130 (FIG. 16B, FIG. 16C). The Rx wiring 106 may include a conductive oxide through which visible light passes such as ITO and IZO or a thin metal wire which scarcely influences visibility, and may be formed by a sputtering method or a sol-gel method.

Figure 17A:
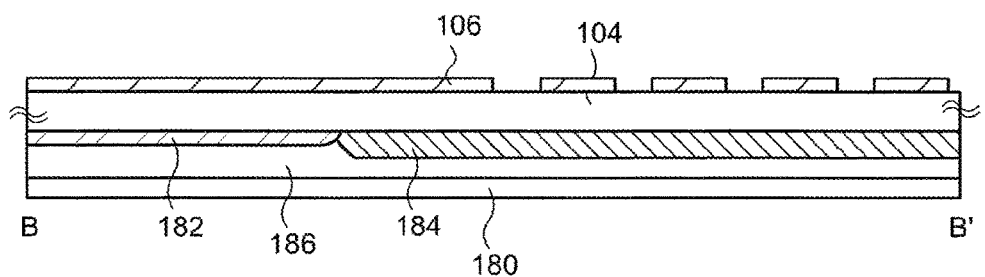
FIG. 17A to FIG. 17C: Diagram describing a manufacturing method of a display device of one embodiment of the present invention.
Figure 17B:
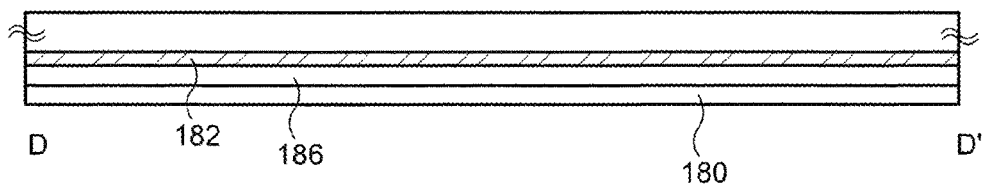
Figure 17C:
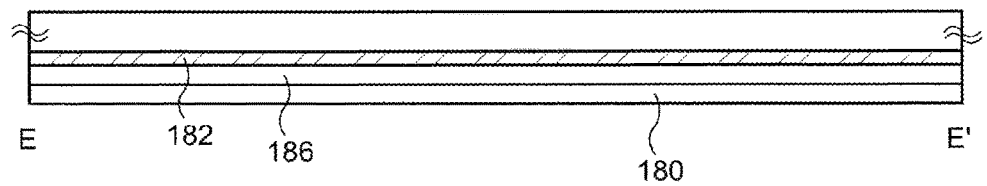

Next, the light shielding film 182 is formed on the surface opposite to the surface of the counter substrate 104 on which the Rx wiring 106 is formed (FIG. 17A to FIG. 17C). The light shielding film 182 may be formed by using a metal with comparatively low reflectance such as chrome and molybdenum, or a resin material including a pigment with black or a similar color, and may be formed using a vapor-deposition method, sputtering method, a CVD method, or a wet-type film formation method.

Next, the color filter 184 is formed in the opening of the light shielding film 182 (FIG. 17A). The color filter 184 may be formed so as to cover a portion of the light shielding film 182. Conversely, the light shielding film 182 may be formed after the color filter 184 is formed. The color filter 184 may be formed by a wet-type film formation method, a vapor deposition method, or the like. The optical properties of the color filter 184 may change for each adjacent pixel 120, by which different colors of light may be obtained for each pixel. The light shielding film 182 and the color filter 184 may be provided above the counter substrate 104 via a base film.

Then, the overcoat 186 is formed so as to cover the light shielding film 182 and the color filter 184 (FIG. 17A to FIG. 17C). The overcoat 186 is a film protecting the light shielding film 182 and the color filter 184 as well as preventing impurities from diffusing to the liquid crystal layer 114. The overcoat 186 may include a macromolecular material such as an epoxy resin, an acrylic resin, a polyimide, and a polyester, and may be formed by applying a wet-type film formation method or a lamination method.

Next, the second orientation film 180 is formed so as to cover the color filter 184 and the light shielding film 182 (FIG. 17A to FIG. 17C). The second orientation film 180 may include the same material as the first orientation film 178, and be formed by the same method. A physical rubbing process may be applied to the second orientation film 180. A photo-orientation process may also be used instead of the rubbing process. The counter substrate 104 may be formed by the above steps.

[3. Cell Assembly Process]

Figure 18A:
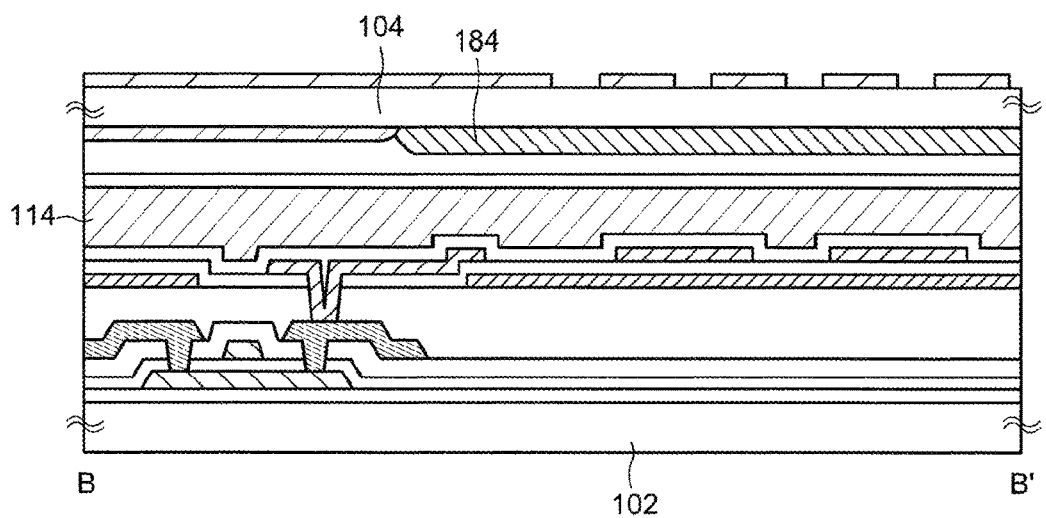
FIG. 18A to FIG. 18C: Diagram describing a manufacturing method of a display device of one embodiment of the present invention.
Figure 18B:
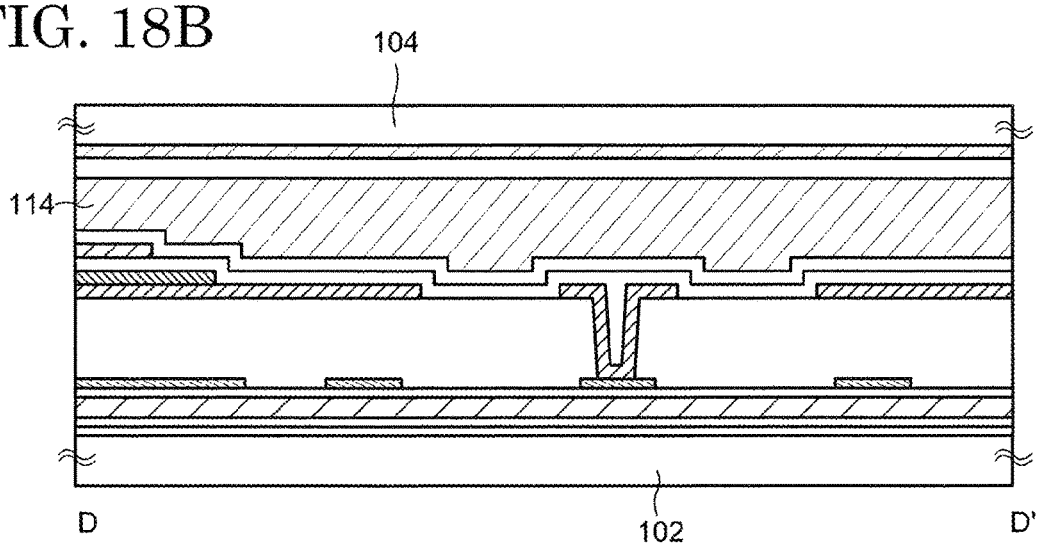
Figure 18C:
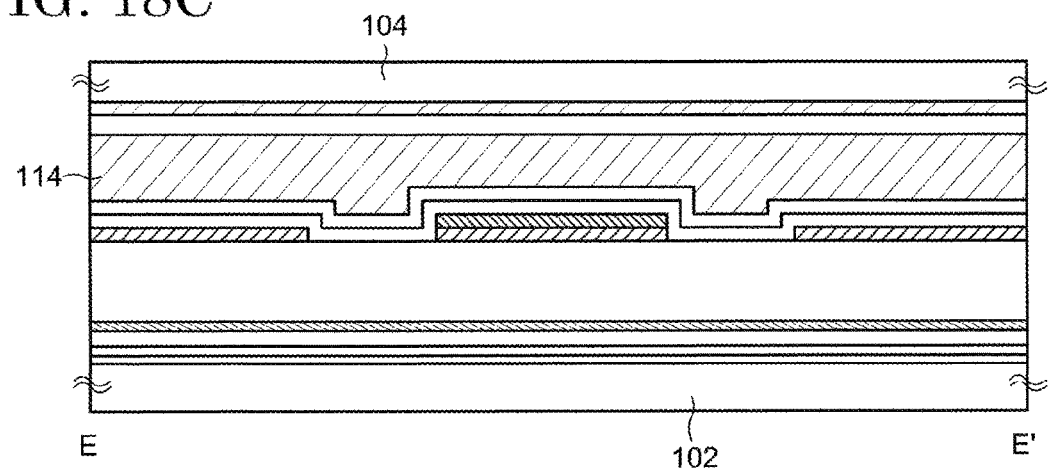

Next, the substrate 102 and the counter substrate 104 are stuck together using the seal 116 so as to sandwich the pixel layer 112, the color filter 184, and the like. The seal 116 is arranged so as to surround the display region 122, the low potential power line 206, and the trap electrodes 222, 230. Next, liquid crystal molecules are injected between the substrate 102 and the counter substrate 104 to form the liquid crystal layer 114 (FIG. 18A to FIG. 18C). Alternatively, liquid molecules are dropped onto either of the substrate 102 and the counter substrate 104, one is arranged above the other, and the substrate 102 and the counter substrate 104 may be stuck together so as to spread the liquid crystal molecules between the substrate 102 and the counter substrate 104. A spacer for maintaining the distance between the substrate 102 and the counter substrate 104 may be added to the liquid crystal layer 114. Instead of additional of the spacer, a spacer including an insulator may be provided above the substrate 102 or the counter substrate 104.

After that, the pair of polarization plates 188, 190 are provided so as to sandwich the substrate 102 and the counter substrate 104 (see FIG. 4). The display device 100 is manufactured by further arranging a backlight not illustrated.

As described in Embodiment 1, in the display device 100 which is one embodiment of the present invention, a plurality of trap electrodes 222 are provided in the peripheral region 130 (or the region between the display region 122 and the terminals 128). Further, it is possible to provide one or a plurality of trap electrodes 230 along three sides of the display region 122 between the side on which the terminals 128 of the display device 100 are not provided and the display region 122. For this reason, ions may be more effectively captured, and the generation of display defects such as display speckles may be effectively inhibited. This effect is beneficial especially when driven at a low frequency, and it becomes possible to provide a high-quality display device with low power consumption.

Each embodiment described above as embodiments of the present invention, as long as they do not contradict each other, may be appropriately combined and implemented. As long as they support the gist of the present invention, any addition, removal, or any design variation of appropriate structural elements, or any addition, omission, or condition alteration of processes made by a person skilled in the art are included in the scope of the present invention.

In the present specification, a display device having mainly liquid crystal elements is exemplified as a disclosure example, but so-called flat panel type display devices such as other light emission type display devices, or electronic paper type display devices having electrophoretic elements are given as other applicable examples. Additionally, without any particular limitation, it may be applicable to small and medium size devices to large devices.

Even if the effects are different from the effects from the implementation of each of the embodiments described above, it is understood that anything made clear from the contents of the present specification, or anything easily predicted by a person skilled in the art, naturally comes from the present invention.

What is claimed is:

1. A display device comprising:
a display region and a peripheral region in contact with the display region above a substrate,
wherein the display region includes:
a plurality of pixels each having a transistor, an insulating film above the transistor, a pixel electrode arranged above the insulating film and electrically connected to the transistor, and a common electrode above the insulating film;
a video signal line and a gate signal line electrically connected to the transistor; and
a liquid crystal layer above the plurality of pixels,
wherein the peripheral region includes:
a terminal electrically connected to the video signal line;
a wiring arranged parallel to the gate signal line between the display region and the terminal; and
a plurality of first electrodes above the wiring,
wherein the insulating film covers the wiring, and
wherein the wiring is electrically connected to the plurality of first electrodes via openings formed in the insulating film.

2. The display device according to claim 1, wherein:
the transistor has a gate electrode, a source electrode, and a drain electrode;
the wiring, the source electrode, and the drain electrode are in the same layer, and
the plurality of first electrodes and the common electrode are separated from each other and exist in the same layer.

3. The display device according to claim 1, wherein:
the transistor has a gate electrode, a source electrode, and a drain electrode;
the wiring, the source electrode, and the drain electrode are in the same layer; and
the plurality of first electrodes and the pixel electrode are separated from each other and exist in the same layer.

4. The display device according to claim 1, wherein:
the transistor has a gate electrode, a source electrode and a drain electrode;
the wiring, the source electrode, and the drain electrode are in the same layer; and
the plurality of first electrodes includes:
a first layer in the same layer as the common electrode; and
a second layer in the same layer as the pixel electrode arranged above the first layer.

5. The display device according to claim 1, further comprising:
an analog switch in the peripheral region of the terminal side, wherein
the plurality of first electrodes is arranged between the display region and the analog switch.

6. The display device according to claim 1, further comprising:
an orientation film between the pixel electrode and the liquid crystal layer, wherein
the orientation film is arranged above the plurality of first electrodes and overlaps the plurality of first electrodes.

7. The display device according to claim 1,
wherein a width of each of the plurality of first electrodes is greater than a width of the wiring.

8. The display device according to claim 1, further comprising:
a second wiring electrically connecting the video signal line to the terminal in the peripheral region of the terminal side,
wherein the transistor has a gate electrode, a source electrode, and a drain electrode, and
the second wiring is in the same layer as the gate electrode.

9. The display device according to claim 1, further comprising:
a counter substrate arranged above the liquid crystal layer and fixed to the substrate by a seal, wherein
the seal surrounds the plurality of first electrodes.

10. The display device according to claim 1, further comprising:
a power-receiving unit arranged above the substrate and electrically connected to the wiring.

11. The display device according to claim 1, further comprising:
a counter substrate above the substrate; and
a plurality of Rx electrodes arranged in a stripe form above the counter substrate,
wherein the common electrode has a plurality of Tx electrodes arranged in a stripe form and overlapping the plurality of pixel electrodes, and
the plurality of Rx electrodes intersects the common electrode to form capacitance.

12. A display device comprising:
a substrate;
a display region above the substrate;
a wiring arranged above the substrate and surrounding the display region; and
a plurality of first electrodes and second electrodes arranged above the wiring and overlapping the wiring, wherein:
the display region is a rectangle having a first side, a second side, a third side, and a fourth side;
the plurality of first electrodes is closest to the first side;
the third side faces the first side;
the second side faces the fourth side;
the display region has a plurality of pixels each including:
a transistor, an insulating film above the transistor, a pixel electrode arranged above the insulating film and electrically connected to the transistor, and a common electrode above the insulating film;
a video signal line and a gate signal line electrically connected to the transistor; and
a liquid crystal layer above the plurality of pixels;
the plurality of first electrodes is arranged along the first side;
the second electrodes are arranged continuously along the second side, the third side, and the fourth side and are in the same layer as the pixel electrode; and
the plurality of first electrodes and the second electrodes are electrically connected to the wiring via openings in the insulating film.

13. The display device according to claim 12, wherein:
the transistor has a gate electrode, a source electrode, and a drain electrode;
the wiring, the source electrode, and the drain electrode are in the same layer, and
the plurality of first electrodes and the common electrode are separated from each other and exist in the same layer.

14. The display device according to claim 12, wherein:
the transistor has a gate electrode, a source electrode, and a drain electrode;
the wiring, the source electrode, and the drain electrode are in the same layer; and
the plurality of first electrodes and the pixel electrode are separated from each other and exist in the same layer.

15. The display device according to claim 12, wherein:
the transistor has a gate electrode, a source electrode, and a drain electrode;
the wiring, the source electrode, and the drain electrode are in the same layer; and
the plurality of first electrodes includes:
a first layer in the same layer as the common electrode; and
a second layer arranged above the first layer and in the same layer as the pixel electrode.

16. The display device according to claim 12, further comprising:
an analog switch above the substrate,
wherein the plurality of first electrodes is arranged between the display region and the analog switch.

17. The display device according to claim 12, further comprising:
an orientation film between the pixel electrode and the liquid crystal layer, wherein
the orientation film is arranged above the plurality of first electrodes and overlaps the plurality of first electrodes.

18. The display device according to claim 12, wherein a width of each of the plurality of first electrodes is greater than a width of the wiring.

19. The display device according to claim 12, further comprising:
a terminal above the substrate;
wherein:
the transistor has a gate electrode, a source electrode, and a drain electrode;
the video signal line is electrically connected to the terminal via a second wiring; and
the second wiring is in the same layer as the gate electrode.

20. The display device according to claim 12, further comprising:
a counter substrate arranged above the liquid crystal layer and fixed to the substrate by a seal, wherein
the seal surrounds the plurality of first electrodes.

* * * * *